US009922796B1

(12) United States Patent
Frosien et al.

(10) Patent No.: US 9,922,796 B1
(45) Date of Patent: Mar. 20, 2018

(54) METHOD FOR INSPECTING A SPECIMEN AND CHARGED PARTICLE MULTI-BEAM DEVICE

(71) Applicants: APPLIED MATERIALS ISRAEL LTD., Rehovot (IL); Technische Universiteit Delft, Delft (NL)

(72) Inventors: Jürgen Frosien, Riemerling (DE); Pieter Kruit, Delft (NL)

(73) Assignee: APPLIED MATERIALS ISRAEL LTD., Rehovot (IL)

(*) Notice: Subject to any disclaimer, the term of this patent is extended or adjusted under 35 U.S.C. 154(b) by 0 days.

(21) Appl. No.: 15/366,455

(22) Filed: Dec. 1, 2016

(51) Int. Cl.
*H01J 37/28* (2006.01)
*H01J 37/147* (2006.01)
*H01J 37/145* (2006.01)
*H01J 37/09* (2006.01)
*H01J 37/22* (2006.01)

(52) U.S. Cl.
CPC ............ *H01J 37/145* (2013.01); *H01J 37/09* (2013.01); *H01J 37/1474* (2013.01); *H01J 37/226* (2013.01); *H01J 37/28* (2013.01); *H01J 2237/0453* (2013.01)

(58) Field of Classification Search
CPC ...... H01J 37/3177; H01J 37/153; H01J 37/28; H01J 37/147; H01J 37/10; H01J 37/12
USPC ..... 250/396 R, 310, 311, 306, 397, 309, 307
See application file for complete search history.

(56) References Cited

U.S. PATENT DOCUMENTS

| | | | | | |
|---|---|---|---|---|---|
| 3,714,422 | A | * | 1/1973 | Hosoki | H01J 37/147 250/310 |
| 4,785,176 | A | * | 11/1988 | Frosien | H01J 37/10 250/305 |
| 6,465,783 | B1 | * | 10/2002 | Nakasuji | G01N 23/225 250/306 |
| 6,483,120 | B1 | * | 11/2002 | Yui | G01N 23/20 250/491.1 |
| 7,663,102 | B2 | * | 2/2010 | Frosien | H01J 37/09 250/310 |
| 7,800,062 | B2 | * | 9/2010 | Goldenshtein | G01N 23/203 250/306 |
| 8,378,299 | B2 | * | 2/2013 | Frosien | H01J 37/147 250/309 |
| 8,841,630 | B2 | * | 9/2014 | Henstra | H01J 37/153 250/310 |

(Continued)

*Primary Examiner* — David A Vanore
(74) *Attorney, Agent, or Firm* — Lowenstein Sandler LLP

(57) ABSTRACT

A method for inspecting a specimen with an array of primary charged particle beamlets in a charged particle beam device having an optical axis. The method includes generating a primary charged particle beam; illuminating a multi-aperture lens plate with the primary charged particle beam to generate the array of primary charged particle beamlets; and correcting a field curvature of the charged particle beam device with a first and a second field curvature correction electrode. The method further includes applying a voltage to the first and to the second field curvature correction electrode. At least one of the field strength provided by the first and the second field curvature correction electrode varies in a plane perpendicular to the optical axis of the charged particle beam device. The method further includes focusing the primary charged particle beamlets on separate locations on the specimen with an objective lens.

29 Claims, 10 Drawing Sheets

(56) References Cited

U.S. PATENT DOCUMENTS

| | | | | |
|---|---|---|---|---|
| 9,035,249 B1* | 5/2015 | Frosien | .................... | H01J 37/05 |
| | | | | 250/310 |
| 9,305,740 B2* | 4/2016 | Frosien | ................. | H01J 37/045 |
| 9,449,789 B2* | 9/2016 | Kruit | .................... | G01N 23/2251 |
| 9,607,805 B2* | 3/2017 | Liu | ......................... | H01J 37/28 |
| 9,673,024 B2* | 6/2017 | Knippelmeyer | ......... | H01J 37/28 |
| 2003/0168606 A1* | 9/2003 | Adamec | .................. | H01J 37/04 |
| | | | | 250/396 R |
| 2004/0135102 A1* | 7/2004 | Muraki | .................. | B82Y 10/00 |
| | | | | 250/492.22 |
| 2004/0232349 A1* | 11/2004 | Kruit | ...................... | B82Y 10/00 |
| | | | | 250/396 R |
| 2010/0178602 A1* | 7/2010 | Seto | ....................... | B82Y 10/00 |
| | | | | 430/30 |
| 2011/0272576 A1* | 11/2011 | Otaki | .................... | B82Y 10/00 |
| | | | | 250/306 |
| 2013/0032729 A1* | 2/2013 | Knippelmeyer | ......... | H01J 37/09 |
| | | | | 250/394 |
| 2013/0248731 A1* | 9/2013 | Tanimoto | ................ | H01J 37/10 |
| | | | | 250/396 R |
| 2017/0243717 A1* | 8/2017 | Kruit | ....................... | H01J 37/28 |

* cited by examiner

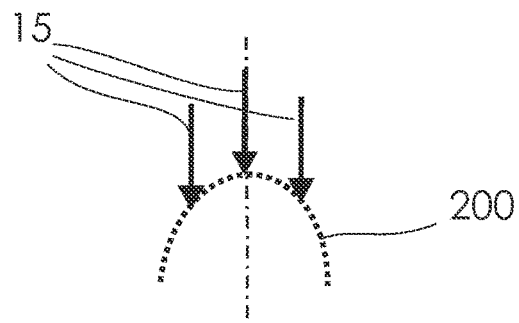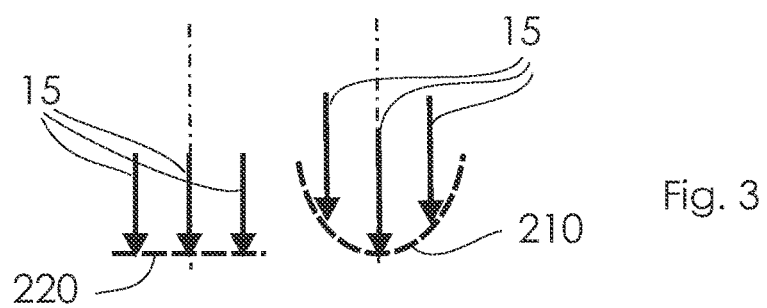
Fig. 3
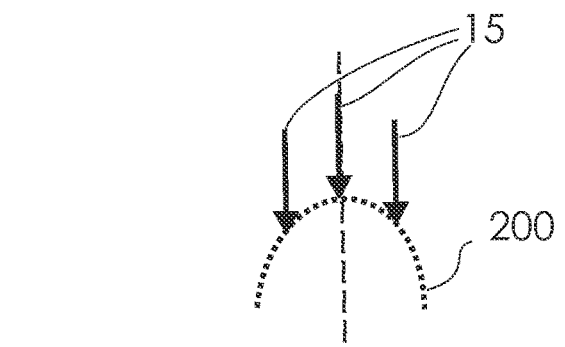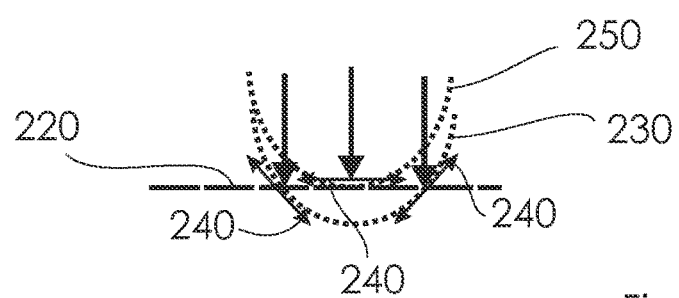
Fig. 4

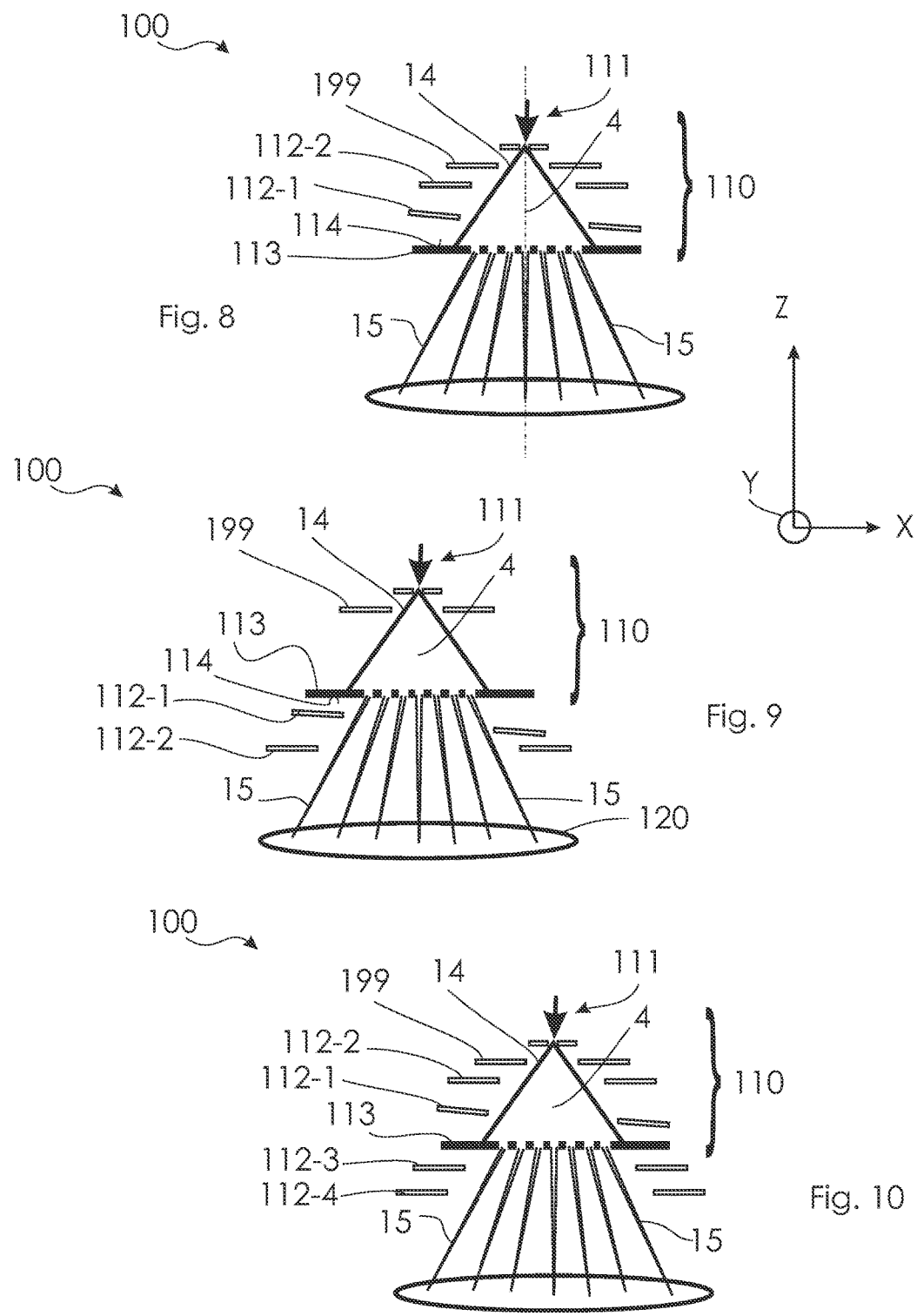

METHOD FOR INSPECTING A SPECIMEN AND CHARGED PARTICLE MULTI-BEAM DEVICE

TECHNICAL FIELD

Embodiments relate to charged particle beam devices, for example, for inspection system applications, testing system applications, defect review or critical dimensioning applications or the like. Embodiments also relate to methods of operation of a charged particle beam device. More particularly, embodiments relate to charged particle beam devices being multi-beam systems for general purposes (such as imaging biological structures) and/or for high throughput EBI (electron beam inspection). Specifically, embodiments relate to a scanning charged particle beam device and a method of electron beam inspection with a scanning charged particle beam device.

BACKGROUND

Modern semiconductor technology is highly dependent on an accurate control of the various processes used during the production of integrated circuits. Accordingly, the wafers are inspected repeatedly in order to localize problems as early as possible. Furthermore, a mask or reticle is also inspected before the actual use during wafer processing in order to make sure that the mask accurately defines the respective pattern. The inspection of wafers or masks for defects includes the examination of the whole wafer or mask area. Especially, the inspection of wafers during the fabrication includes the examination of the whole wafer area in such a short time that production throughput is not limited by the inspection process.

Scanning electron microscopes (SEM) have been used to inspect wafers. The surface of the wafer is scanned using e.g. a single finely focused electron beam. When the electron beam hits the wafer, secondary electrons and/or backscattered electrons, i.e. signal electrons, are generated and measured. A pattern defect at a location on the wafer is detected by comparing an intensity signal of the secondary electrons to, for example, a reference signal corresponding to the same location on the pattern. However, because of the increasing demands for higher resolutions, scanning the entire surface of the wafer takes a long time. Accordingly, using a conventional (single-beam) Scanning Electron Microscope (SEM) for wafer inspection is difficult, since the approach does not provide the respective throughput.

Wafer and mask defect inspection in semiconductor technology needs high resolution and fast inspection tools, which cover both full wafer/mask application or hot spot inspection. Electron beam inspection gains increasing importance because of the limited resolution of light optical tools, which are not able to handle the shrinking defect sizes. In particular, from the 20 nm node and beyond, the high-resolution potential of electron beam based imaging tools is in demand to detect all defects of interest.

In view of the above, a charged particle multi-beam device and a method for inspecting a specimen with an array of beamlets of charged particles is provided that overcome at least some of the problems in the art.

SUMMARY

In light of the above, a method for inspecting a specimen with an array of beamlets of charged particles and a charged particle multi-beam device according to the independent claims are provided. Further aspects, advantages, and features are apparent from the dependent claims, the description, and the accompanying drawings.

According to one embodiment, a method for inspecting a specimen with an array of primary charged particle beamlets in a charged particle beam device is provided. The method includes generating a primary charged particle beam with a charged particle beam emitter; illuminating a multi-aperture lens plate having a surface with the primary charged particle beam to generate the array of primary charged particle beamlets which are focused; generating an electrical field by at least a first electrode on the surface of the multi-aperture lens plate; wherein a field component in z-direction of the electrical field provided by the at least first electrode is non-rotational-symmetric; and focusing the primary charged particle beamlets on separate locations on the specimen with an objective lens to simultaneously inspect the specimen at the separate locations.

According to another embodiment, a charged particle beam device for inspection of a specimen with an array of primary charged particle beamlets is provided. The charged particle beam device includes a charged particle beam source for generating an array of primary charged particle beamlets, wherein the charged particle beam source includes a charged particle beam emitter for emitting a charged particle beam; a multi-aperture lens plate having a surface, the multi-aperture lens plate comprising at least two openings to generate and focus an array of primary charged particle beamlets, the multi-aperture lens plate being arranged for being illuminated with the primary charged particle beam; at least a first electrode for generating an electrical field on the surface of the multi-aperture lens plate, the at least first electrode having a radial direction, a circumferential direction and an aperture opening through which the primary charged particle beam or the primary charged particle beamlets pass, wherein the at least first electrode is segmented in circumferential direction into at least two separate electrode segments; and an objective lens for focusing each primary charged particle beamlet of the array of primary charged particle beamlets to a separate location on the specimen.

According to another embodiment, a charged particle beam device for inspection of a specimen with an array of primary charged particle beamlets is provided. The charged particle beam device includes a charged particle beam source for generating an array of primary charged particle beamlets, wherein the charged particle beam source includes: a charged particle beam emitter for emitting a charged particle beam; a multi-aperture lens plate comprising at least two openings to generate and focus an array of primary charged particle beamlets, the multi-aperture lens plate being arranged for being illuminated with the primary charged particle beam; at least a first electrode for generating an electrical field on the surface of the multi-aperture lens plate; the at least first electrode having aperture openings through which the primary charged particle beam or the primary charged particle beamlets pass, wherein the at least first electrode is tilted with respect to a plane being perpendicular to the optical axis of the charged particle beam device; and an objective lens for focusing each primary charged particle beamlet of the array of primary charged particle beamlets to a separate location on the specimen.

According to another embodiment, a multi-column microscope for inspection of a specimen is provided. The multi-column microscope includes a charged particle beam device for inspection of a specimen with an array of primary charged particle beamlets, the charged particle beam device comprising an optical axis extending in z-direction of the charged particle beam device and further including: a charged particle beam source for generating an array of primary charged particle beamlets, wherein the charged particle beam source includes: a charged particle beam emitter for emitting a charged particle beam; a multi-aperture lens plate comprising at least two openings to generate and focus an array of primary charged particle beamlets, the multi-aperture lens plate being arranged for being illuminated with the primary charged particle beam; at least a first electrode for generating an electrical field on the surface of the multi-aperture lens plate; the at least first electrode having aperture openings through which the primary charged particle beam or the primary charged particle beamlets pass, wherein the at least first electrode is tilted with respect to a plane being perpendicular to the optical axis of the charged particle beam device and/or wherein the at least first electrode is segmented in circumferential direction into at least two separate electrode segments; and the charged particle beam device further includes an objective lens for focusing each primary charged particle beamlet of the array of primary charged particle beamlets to a separate location on the specimen; the multi column microscope further includes: a further charged particle beam source for generating a further array of primary charged particle beamlets.

Embodiments are also directed at apparatuses for carrying out the disclosed methods and include apparatus parts for performing each described method features. The method features may be performed by way of hardware components, a computer programmed by appropriate software, by any combination of the two or in any other manner. Furthermore, embodiments are also directed at methods which the described apparatus operates with. Embodiments include method features for carrying out every function of the apparatus.

BRIEF DESCRIPTION OF THE DRAWINGS

So that the manner in which the above recited features can be understood in detail, a more particular description, briefly summarized above, may be had by reference to embodiments. The accompanying drawings relate to embodiments and are described in the following:

FIG. 3 shows a schematic drawings of beam behavior without and with field correction according to embodiments described herein;

FIG. 4 shows a schematic drawing of beam behavior with field correction and scanning of the beams according to embodiments described herein;

FIGS. 8 to 10 show schematic drawings of field correction electrodes in a partial view of a charged particle beam device according to embodiments described herein;

DETAILED DESCRIPTION OF EMBODIMENTS

Reference will now be made in detail to the various embodiments, one or more examples of which are illustrated in the figures. Within the following description of the drawings, the same reference numbers refer to same components. The differences with respect to individual embodiments are described. Each example is provided by way of explanation and is not meant as a limitation. Further, features illustrated or described as part of one embodiment can be used on or in conjunction with other embodiments to yield yet a further embodiment. The description is intended to include the modifications and variations.

Without limiting the scope of protection of the present application, in the following the charged particle beam device or components thereof will exemplarily be referred to as a charged particle beam device including the detection of secondary or backscattered particles, such as electrons. Embodiments can still be applied for apparatuses and components detecting corpuscles, such as secondary and/or backscattered charged particles in the form of electrons or ions, photons, X-rays or other signals in order to obtain a specimen image. When referring to corpuscles, the corpuscles are to be understood as light signals in which the corpuscles are photons as well as particles, in which the corpuscles are ions, atoms, electrons or other particles. As described herein, discussions and descriptions relating to the detection are exemplarily described with respect to electrons in scanning electron microscopes. Other types of charged particles, e.g. positive ions, could be detected by the device in a variety of different instruments.

According to embodiments herein, which can be combined with other embodiments, a signal (charged particle) beam, or a signal (charged particle) beamlet is referred to as a beam of secondary particles, i.e. secondary and/or backscattered particles. Typically, the signal beam or secondary beam is generated by the impingement of the primary beam or primary beamlet on a specimen or by backscattering of the primary beam from the specimen. A primary charged particle beam or a primary charged particle beamlet is generated by a particle beam source and is guided and deflected on a specimen to be inspected or imaged.

A "specimen" or "sample" as referred to herein, includes, but is not limited to, semiconductor wafers, semiconductor workpieces, photolithographic masks and other workpieces such as memory disks and the like. Embodiments may be applied to any workpiece on which material is deposited or which is structured. A specimen includes a surface to be structured or on which layers are deposited, an edge, and typically a bevel. According to some embodiments, which can be combined with other embodiments described herein, the apparatus and methods are configured for or are applied for electron beam inspection, for critical dimensioning applications and defect review applications.

Figure 1:
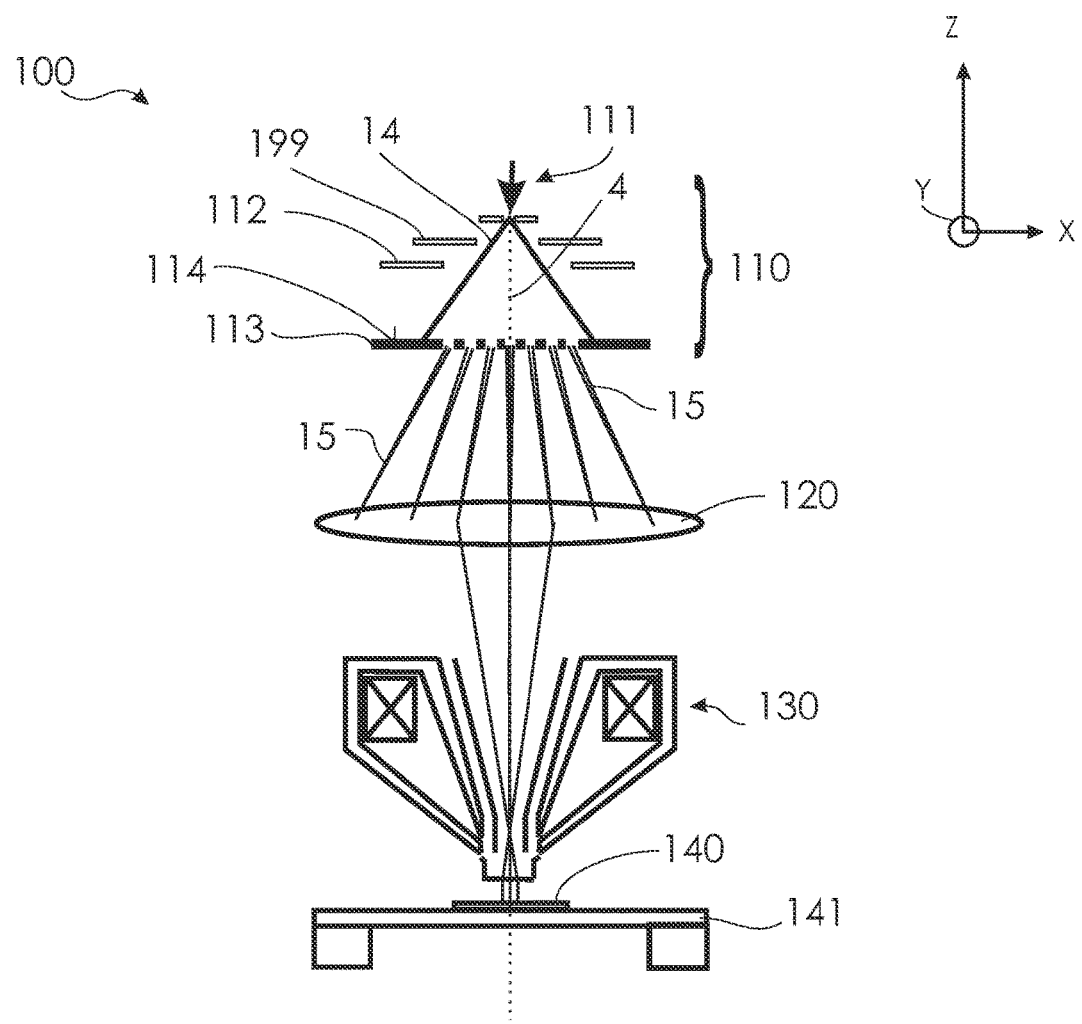
FIG. 1 shows a schematic drawing of a multi-beam device for specimen inspection according to embodiments described herein.

An embodiment of a charged particle beam device is shown schematically in FIG. 1. The charged particle beam device 100 includes a charged particle beam source 110 including a particle beam emitter 111, which emits a primary charged particle beam 14. According to embodiments described herein, the charged particle beam source 110 is adapted for generating an array of primary charged particle beamlets 15. The charged particle beam source 110 may include the charged particle beam emitter 111, and a multi-aperture lens plate 113. In some embodiments, such as the embodiment shown in FIG. 1, the primary charged particle beam 14 may be accelerated by an accelerating voltage supplied to the acceleration electrode 199 (voltage difference between the charged particle beam emitter 111 and the acceleration electrode 199). According to embodiments described herein, the charged particle beam device includes a first electrode 112, e.g. at least a first electrode 112. In the embodiment of FIG. 1, the first electrode 112 is exemplarily shown placed between the charged particle beam emitter 111 and the multi-aperture lens plate 113. According to other embodiments, the first electrode 112 may also be placed below the multi-aperture lens plate 113 (when seen in the direction of the propagating charged particle beamlets.

According to embodiments described herein, the first electrode of the charged particle beam device, or the at least first electrode of the charged particle beam device respectively, is adapted and driven to generate an electrical field on the surface of the multi-aperture lens plate. The surface of the multi-aperture lens plate 113 is denoted with reference sign 114 in FIG. 1. According to some embodiments, the surface 114 may be a surface of the multi-aperture lens plate facing the first electrode 112. For instance, in the case that the first electrode is placed before the multi-aperture lens plate (in the direction of the propagating beamlets or the propagating primary charged particle beam 14 as shown in FIG. 1), the surface, on which the first electrode generates the electrical field is the upper surface of the multi-aperture lens plate (as indicated by reference number 114 in FIG. 1). Alternatively, in the case that the first electrode is placed below the multi-aperture lens plate (in the direction of the propagating primary charged particle beamlets 15 or the propagating primary charged particle beam 14), the surface, on which the first electrode generates the electrical field is the lower surface of the multi-aperture lens plate.

The charged particle beam source 110 including the beam emitter, the multi-aperture lens plate and the first electrode may be denoted as an upper part of the charged particle beam device. The charged particle beam device 100 exemplarily further includes a lens 120, an objective lens 130, and a specimen stage 141, on which a specimen 140 may be placed. The lens 120, the objective lens 130, and the specimen stage 141 may be described as being part of the lower part of the charged particle beam device.

According to embodiments described herein, the first electrode of the charged particle beam device is adapted and driven to generate an electrical field on the surface of the multi-aperture lens plate as mentioned above. According to embodiments described herein, the electrical field having the z-component is generated by a voltage difference between the first electrode 112 and the multi-aperture lens plate 113. The electrical field may have a z-component extending in the z-direction of the charged particle beam device. According to some embodiments, the z-direction of the charged particle beam device may run along the optical axis, as can exemplarily be seen in the coordinate system on the left of the charged particle beam device 100 in FIG. 1. According to embodiments described herein, the component of the electrical field in z-direction provided by the first electrode is non-rotational-symmetric on the surface of the multi-aperture lens plate. For instance, the strength of the electrical field varies over the plane of the surface of the multi-aperture lens plate. According to some embodiments, z-component of the electrical field provided by the first electrode being non-rotational symmetric may mean that the z-component of the electrical field cannot be rotated about a fixed point without changing the strength of the electrical field.

The non-rotational symmetry of the z-component of the electrical field on the surface of the multi-aperture lens plate can be combined with a field curvature correction by the at least two electrodes, especially in the following ways. For instance, the configuration of the z-component of the electrical field according to embodiments described herein may be realized by one electrode arrangement (e.g. only a segmented electrode as will be explained in detail below, especially with respect to FIGS. 5 to 7) or in separated configurations regarding the location of the electrode before and behind the multi aperture lens plate (as is and will be explained in detail with respect to the configurations of FIGS. 1, 2, and 11).

According to some embodiments, the electrical field generated by the first electrode may have several effects and can be used for different situations. One application of the varying field of the first electrode on the surface of the multi-aperture lens plate in the charged particle beam device according to embodiments described herein is to use the first electrode for compensating or correcting the field curvature of the charged particle beam device, in particular the field curvature introduced by imaging lenses of the charged particle beam device. According to some embodiments, for compensating or correcting the field curvature, more than one electrode may be used. In some embodiments, the at least first electrodes may be used for compensating or correcting the field curvature introduced by the imaging lenses of the charged particle beam device being arranged downstream of the multi-aperture lens plate of the charged particle beam device, when seen in a direction of the propagating primary charged particle beam, or the primary charged particle beamlets. In particular, the at least one electrode may be used for compensating or correcting the field curvature introduced by the objective lens of the charged particle beam device, as will be explained in detail below. According to some embodiments, the first electrode providing a non-rotational z-component of the electrical filed on the surface of the multi-aperture lens plate may be used for compensating a sample tilt and the effects coming with a tilted sample. For instance, the varying field may be used for compensating errors of the beam spot on the sample, as will be explained in detail below.

The charged particle beam device and the method for inspecting a specimen with a charged particle beam device according to embodiments described herein provide a small spot size of the primary charged particle beamlets on the specimen. The spot size may be understood as a diameter of the area on the specimen illuminated by a single primary charged particle beamlet. For instance, the spot size of a single primary charged particle beamlet of the array of primary charged particle beamlets according to embodiments described herein may typically be less than 20 nm, more typically less than 10 nm, and even more typically less than 5 nm. According to some embodiments, the single primary charged particle beamlets may have a high current density. The high current density helps to increase the imaging quality. Due to the generation of the array of primary charged particle beamlets with a beam source according to embodiments described herein the total current for imaging is increased which improves the throughput.

Figure 2:
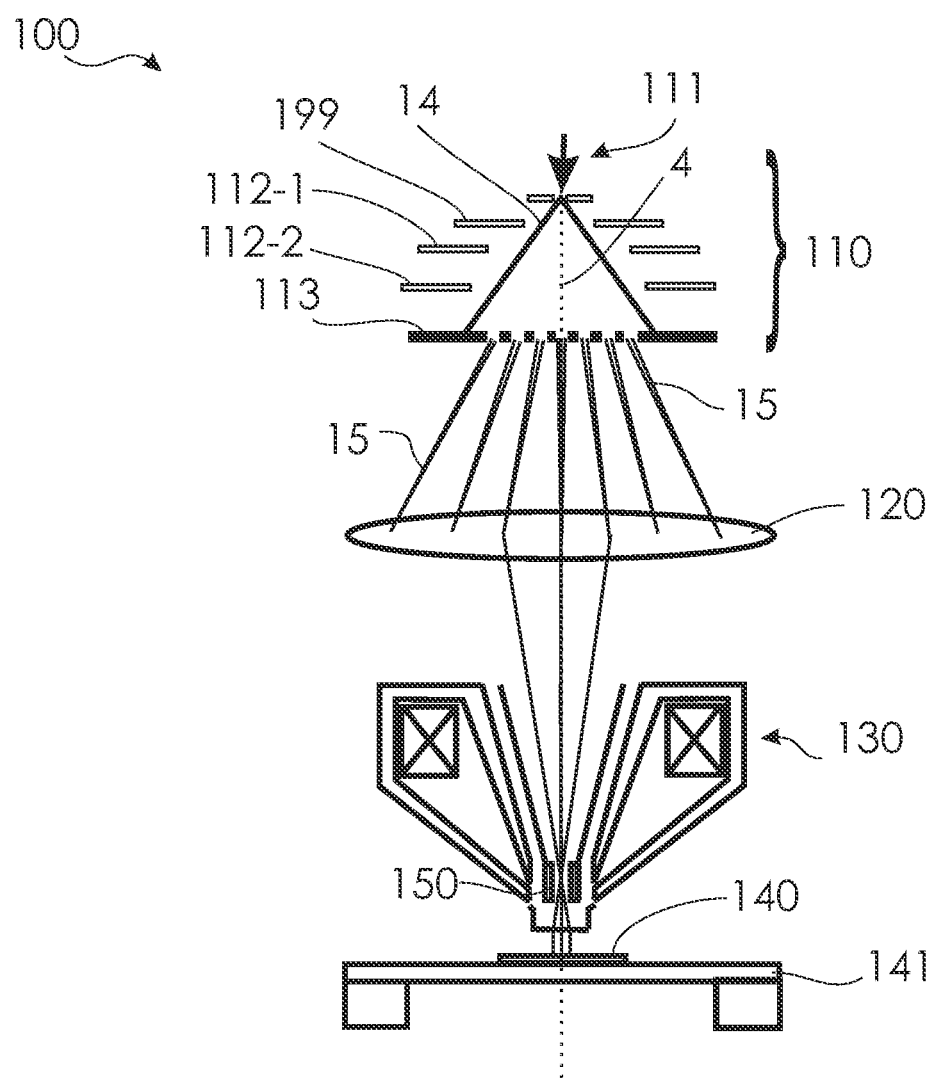
FIG. 2 shows a schematic drawing of a multi-beam device for specimen inspection according to embodiments described herein.

According to some embodiments, the charged particle beam device as described herein may have more than one electrode for generating an electrical field. FIG. 2 exemplarily shows an embodiment with more than one electrode. According to embodiments described herein, the charged particle beam device includes electrodes 112-1 and 112-2 (exemplarily shown two electrodes). According to some embodiments, the first electrode may be used to give the electrical field to create the aperture lenses and the second electrode may be used as the field curvature correction electrode. In some embodiments, and in particular in embodiments with more than one electrode, the electrode being the nearest electrode to the multi-aperture lens plate may be denoted as first electrode according to embodiments described herein. In FIG. 2, the electrode 112-2 would be denoted as first electrode according to embodiments described herein. In some embodiments, the more than one electrodes may act together to provide an electrical field, the z-component of which is non-rotational symmetric on the surface of the multi-aperture lens plate. In the embodiment of FIG. 2, the electrodes 112-1 and 112-2 are exemplarily shown placed between the charged particle beam emitter 111 and the multi-aperture lens plate 113. Further, according to some embodiments, the charged particle beam device 100 may include a scanning deflector 150. The scanning deflector 150 can provided between the 120 and the specimen stage 141. Particularly, the scanning deflector can be provide surrounded by a pole piece assembly of the objective lens 130 and/or at a position of an electrode of a electrostatic lens. FIG. 2 shows an embodiment, which can be combined with other embodiments of the present disclosure, wherein the scanning deflector is provided with an upper electrode of a deceleration lens.

The effect of field correction electrodes is exemplarily shown in FIGS. 3 and 4. FIG. 3 shows a schematic drawing of primary charged particle beamlets 15 being shown as arrows. In the upper part of FIG. 3, the three arrows indicating three adjacent beamlets of charged particles are arranged or proceed distributed along a curve 200 being shown in a dotted line. For instance, the field curvature correction electrodes according to embodiments described herein cause the primary charged particle beamlets 15 to propagate distributed on curve 200. The field curvature correction being shown as curve 200 in FIG. 3 may be used for compensating the field curvature effect of a lens (such as the objective lens) in the charged particle beam device. The influence of a lens on the field, in which the beamlets propagate, is exemplarily shown in the lower right drawing of FIG. 3. The field influenced by a lens in the charged particle beam device yields the distribution of beamlets along a curve 210 as schematically shown in FIG. 3. According to some embodiments, the curve, over which the beamlets are distributed, may be a parabolic curve. Due to the shape of the distribution of the beamlets along the curve, the effect of the lens may be described as being a field curvature effect.

In the left lower drawing of FIG. 3, the field curvature introduced by a lens in the charged particle beam device is corrected by the one or more electrodes according to embodiments described herein. In some embodiments, the one or more electrodes providing the non-rotational z-component of an electrical field on the multi-aperture lens plate may be denoted as field curvature correction electrodes or as focus correction electrodes. For instance, the focus correction electrodes can be used for a field curvature correction being shown by curve 200, wherein the electrode compensates the field curvature 210 of a lens. The compensation results in a focus plane 220 as shown as a broken line in FIG. 3. The situation shown in FIG. 3 can be described as being a global field correction. All beamlets substantially hit the specimen at the same time, in the same plane, and at the same energy. The result is an increase in imaging preciseness and imaging reliability.

In FIG. 4, the upper drawing is similar to the upper drawing of FIG. 3 referring to a curve 200. In particular, the upper drawing of FIG. 4 shows a situation, in which a field curvature correction is introduced and the primary charged particle beamlets 15 propagate distributed along a curved formation. The curve 200 is shown in a dotted line. The lower drawing of FIG. 4 shows a situation where the primary charged particle beamlets 15 are additionally (to the field curvature) subjected to a scanning field for scanning the beamlets over the specimen with a scan deflector. The focus plane (line 220) after the global field curvature (as described with respect to FIG. 3) is shown in a broken line. Due to the scanning field in the charged particle beam device, the off-axis beamlets are quasi shifted along a curve 230 to the up, to the down, to the left, to the right, or a combination of the aforementioned directions (as shown by the direction arrows 240 in FIG. 4). The spots of the beamlets on the specimen are defocused during scanning. The beamlet in the middle (also denoted as on-axis beamlet) has the lowest deviation, and the outermost beamlets have a higher deviation than the middle beamlet. Single points of the specimen may be imaged correctly; the more beams are used, the larger is the deviation for the beamlets being not in the middle. According to some embodiments, also the middle beamlet may be shifted along a curve 250; the de-focus of the middle beam would be symmetric (different to the de-focus of the off-axis beams) as exemplarily shown by arrow 240 (marking the defocusing area during scan). The shifting of the beamlets along a curve decreases the imaging preciseness of the charged particle beam device. In particular and as can be seen in FIG. 4, the dotted curve 230 shows the shifted field curvature parabola caused by global correction for the two outer beamlets. During scan, the two outer beamlets are defocused asymmetrically along the shifted field curvature curve 230. The defocusing range of the two outer beams is indicated by the outer double arrows 240. The asymmetric defocus is larger than the defocus in the center because of the parabolic behavior. Dynamic field curvature correction will add a dynamic focus which follows along the arrows direction from the new virtual centrum. For instance, a dynamic field curvature correction (especially the correction of the field curvature introduced by the primary charged particle beamlet scanning) may be performed, in particular in synchronism with the scan of the primary charged particle beamlets on the sample. According to some embodiments, which can be combined with other embodiments described herein, a method for inspecting a specimen with an array of primary charged particle beamlets in a charged particle beam device can include scanning the primary charged particle beamlets over the specimen by a scan deflector, wherein generating the electrical field by the at least first electrode comprises performing a dynamic field curvature correction.

According to some embodiments, a similar situation as shown in FIG. 4 may arise, when a specimen is provided in a tilted manner (compared to an arrangement of the specimen in a plane being substantially perpendicular to the optical axis of the charged particle beam device). A tilted sample results in one side being higher, the other side is lower with respect to the central primary charged particle beamlet. According to some embodiments, the correction of the sample tilt effects with the first electrode may be described as a "static correction." On top of the defocus by sample tilt, the lens of the charged particle beam device introduces a field curvature. The spots on the specimen, on which the beamlets hit the specimen, may be defocused. The spots being defocused may result in a minor imaging quality.

The focus plane after global/static field curvature correction is shown in line 220 for the three beamlets. If a beamlet scan takes place after the field curvature correction device, every beamlet position deviation from the corrected location will result in a defocussing which follows the shifted field curvature curve. The field curvature curve shift is determined by the global field curvature correction. The resulting defocussing effect is indicated by the arrows 240. A dynamic field correction according to embodiments described herein is shown in FIG. 4 for the two outer primary charged beamlets. In particular, the dynamic field correction may also take into account the deviation of the focus spot due to a scanning filed. In case of a tilted specimen, a static operation of the field curvature correction electrodes may be used.

According to embodiments described herein, the electrode(s) and the method for inspecting a specimen with an array of primary charged particle beamlets described herein allow to correct the field curvature introduced by a lens in the charged particle beam device and avoid at the same time the impacts of a scanning field on the focus spots of the beamlets on the specimen. Embodiments described herein refer to a dynamic correction of the field curvature, taking into account the scanning field. In particular, an asymmetric correction of the field curvature can be provided embodiments described herein, in particular by the dynamic correction. For instance, the asymmetric correction may be beneficial in the case of a scanning field and/or a tilted specimen.

According to embodiments described herein, the electrode(s) and methods for inspecting a specimen with an array of primary charged particle beamlets as described herein may introduce an additional "wedge error" (speaking in terms of geometrical arrangements) for compensating the field curvature and the impacts of the scanning field and/or the impacts of a tilted specimen. For instance, the field curvature correction electrodes and the method for inspecting a specimen with an array of primary charged particle beamlets according to embodiments described herein may provide the same (or at least a similar) effect than a lens and a scanning field in the charged particle beam device. In particular, the design of the electrode(s), the control of the electrode(s), and the arrangement of the electrode(s) in the charged particle beam device allow to provide the aforementioned effects, as will exemplarily described below with respect to FIGS. 5 to 10.

Figure 5:
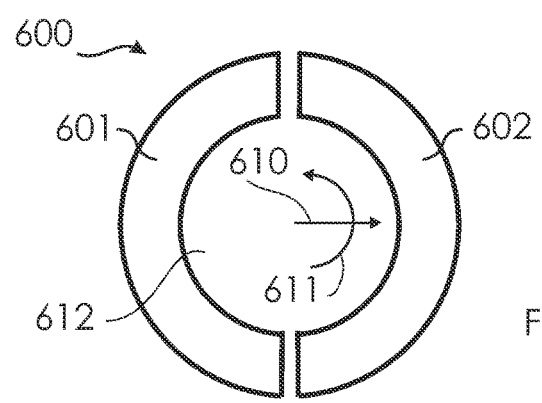
FIGS. 5 to 7 show schematic drawings of field correction electrodes according to embodiments described herein.

FIG. 5 shows an embodiment of an electrode of a focus correction device, for example a field curvature correction device according to embodiments described herein. In some embodiments, which may be combined with other embodiments described herein, the electrode (being in particular used for field curvature correction) according to embodiments described herein may be denoted as a field curvature correction electrode. The electrode 600 has a radial direction 610, a circumferential direction 611 and one or more aperture openings 612 through which the primary charged particle beam or the primary charged particle beamlets pass (depending on the location of the field curvature correction electrodes). The electrode of FIG. 5 is segmented in circumferential direction into two separate electrode segments 601 and 602. According to some embodiments, an electrode referred to herein and being segmented may provide for a dipole, a quadrupole or a pole of higher order.

According to some embodiments described herein, the segments of an electrode as described herein together form the electrode, in particular a field curvature correction electrode. For instance, the segments may be physically separated by a gap between the segments, wherein the segments together form the electrode. According to some embodiments, the segments of the electrode may individually be controllable. For instance, the segments of the electrode may individually be connected or connectable to separate power supplies (as exemplarily shown and explained in FIG. 6). Controlling the single segments individually (and dynamically) allows a correction of the defocused spots on the specimen due to the field curvature and the scanning field (as explained above with respect to FIG. 4). In particular, the segmented electrode (and/or the tilted arrangement of the field curvature correction electrodes, as will be explained below with respect to FIGS. 8 to 10) provide a field strength that varies in a plane perpendicular to the optical axis of the charged particle beam device (such as optical axis 4 in FIG. 1) on the surface of the multi-aperture lens plate or that has a z-component on the multi-aperture lens plate being non-rotational symmetric. In the case of segmented electrodes, the field strength in a plane perpendicular to the optical axis of the charged particle beam device varies on the surface of the multi-aperture lens plate due to the separate segments of the electrode, which can individually be controlled.

According to some embodiments, the single segments of the electrode can be controlled (in particular individually and/or dynamically) and may provide field strengths to generate an asymmetric field correction. In particular, the asymmetric field correction may be done dependent on the scanning field, or dependent on the change in the scanning field. In some embodiments, which may be the combined with other embodiments described herein, the electrode and the scanning device providing the scanning field may be connected to a controller or a control unit. The controller or the control unit may be able to calculate (and control) the power supplied to the single segments based on data received from the scanning device. In particular, the dynamic field curvature correction with an electrode(s) according to embodiments described herein may be performed in synchronization of the field strength(s) provided by the electrode(s) according to embodiments described herein with the scanning device.

In one example, the electrode 600 as shown in FIG. 5 may be controlled as follows: The segment 601 may be supplied with a voltage $U+c*U_{scan\ x}$; the segment 602 may be supplied with a voltage $U-c*U_{scan\ x}$. The voltage "U" may be a standard voltage supplied for the focus correction or the global field curvature correction. The addition or subtraction of $U_{scan}$ may be supplied dependent on the scanning voltage in the case of an electrostatic scan device, wherein a correction factor "c" may be considered. When adding or subtracting the voltage $U_{scan}$ to the global field curvature correction voltage, the x- and y-direction of the scanning voltage may be considered.

Figure 6:
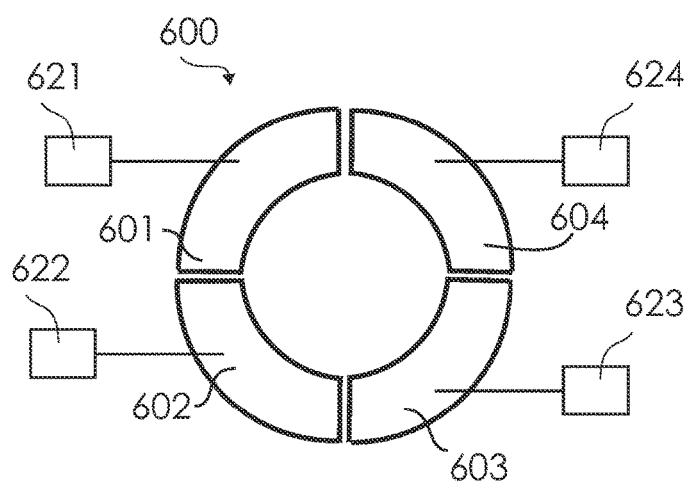
Figure 7:
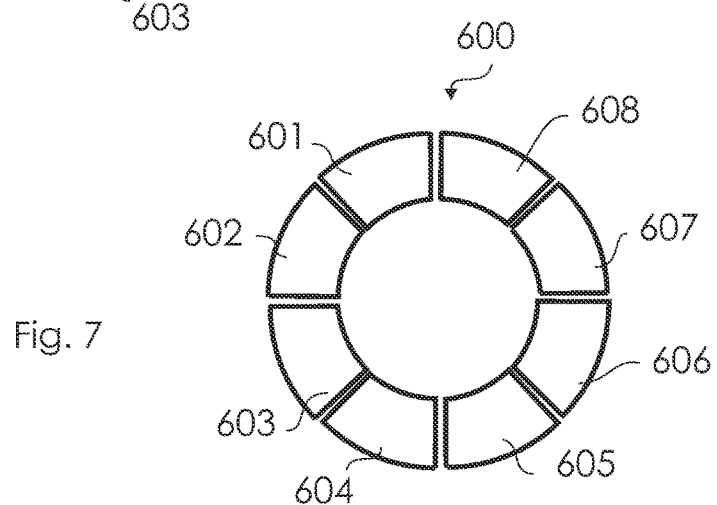

FIG. 6 shows an embodiment of a electrode 600 having four segments 601, 602, 603, and 604. Each of the segments 601, 602, 603, and 604 is connected to a separate power supply 621, 622, 623, and 624, respectively. The segment 601 may be supplied with a voltage $U+c*U_{scan\ x}$; the segment 602 may be supplied with a voltage $U-c*U_{scan\ y}$; the segment 603 may be supplied with a voltage $U-c*U_{scan\ x}$; and the segment 604 may be supplied with a voltage $U+c*U_{scan\ y}$. The voltage "U" may be a standard voltage supplied for the focus correction or global field curvature correction. The electrode as exemplarily shown in FIG. 6 provides a quadrupole. In FIG. 7, an octupole is provided by a electrode 600 being segmented in eight separate segments 601 to 608. The electrode being provided as a multipole (such as the shown octupole) may result in a more homogeneous deflection field distribution. The multipole design of a electrode according to embodiments described herein may allow a more precise correction and synchronization with the scanning device. The electrode being provided in the form of a multipole may deliver an increased performance, and improve the imaging quality. Embodiments described herein are not limited to the shown examples of electrodes. For instance, the electrode according to embodiments described herein may be segmented in more than eight segments, such as twelve segments providing a 12-pole design of the electrode.

According to some embodiments, which may be combined with other embodiments described herein, and in the case that more than one electrode is provided (as for instance shown in FIG. 2) either one of the electrodes, or both, may be provided in a segmented manner. In some embodiments, the first electrode may be provided in a segmented design. According to some embodiments, which may be combined with other embodiments described herein, there is no limitation as of the arrangement, the order, or the number of segments of each of the electrodes for the electrodes according to embodiments described herein.

According to some embodiments described herein, a field curvature correction device may include at least a first field curvature correction electrode and a second field curvature correction electrode. The first field curvature correction electrode and the second field curvature correction electrode of the field curvature correction device can be separately arranged, individually designed and/or individually controlled.

FIG. 8 shows the upper part of a charged particle beam device according to embodiments described herein. The charged particle beam device includes a field curvature correction device including a first field curvature correction electrode 112-1 and a second field curvature correction electrode 112-2. In FIG. 8, the electrode 112-1 being nearest to the multi-aperture lens plate 113 is denoted as first electrode or first field curvature correction electrode. In the example shown in FIG. 8, the first field curvature correction electrode 112-1 is tilted with respect to a plane being substantially perpendicular to the optical axis 4 of the charged particle beam device. For instance, by the tilt of the first electrode 112-1, the electrode may provide an electrical field on the surface of the multi-aperture lens plate 113, wherein the z-component of the electrical field is non-rotational symmetric. It may be understood that, in some embodiments, which may be combined with other embodiments described herein, (for instance additionally) the second field curvature correction electrode may be tilted. In the example of FIG. 8, the first field curvature correction electrode 112-1 is tilted in x-direction, as can be seen in the coordinate system shown beside FIG. 8. In the embodiment shown in FIG. 8, both the first field curvature correction electrode 112-1 and the second field curvature correction electrode 112-2 are located before the multi-aperture lens plate 113. The surface of the multi-aperture lens plate 113, on which the electrical field of the electrodes is provided, is the surface 114 facing the first electrode 112-1. By tilting at least one of the electrodes of the field curvature correction device, a field curvature correction is possible, e.g. for a tilted specimen. In some embodiments, the tilted electrode may be used for dynamic field curvature correction in the case of a scanning field (in particular when using a dynamic field strength of the electrical field generated by the first electrode). According to some embodiments, by controlling the field strength dynamically, the quantity of the wedge effect may be influenced.

FIG. 9 shows the upper part of a charged particle beam device according to some embodiments described herein. The charged particle beam device as shown in FIG. 9 includes a first field curvature correction electrode 112-1 and a second field curvature correction electrode 112-2. Both field curvature correction electrodes are arranged below the multi-aperture lens plate 113 in direction of the propagating beamlets. The electrical field of the electrodes 112-1 and 112-2 is provided on the surface 114 of the multi-aperture lens plate, which is (in the case of the arrangement shown in FIG. 9) the lower surface of the multi-aperture lens plate 113 when seen in the direction of the propagating beamlets. The first field curvature correction electrode 112-1 is tilted with respect to a plane being substantially perpendicular to the optical axis 4. The arrangement of the field curvature correction electrodes before and below the multi-aperture lens plate 113 is described in detail below, in particular with respect to FIGS. 1 and 11. In the examples of FIGS. 8 and 9, the field curvature scan correction is done in x-direction.

FIG. 10 shows an embodiment, in which the charged particle beam device includes four field curvature correction electrodes 112-1, 112-2, 112-3 and 112-4. Two field curvature correction electrodes, the field curvature correction electrodes 112-1 and 112-2, are arranged before the multi-aperture lens plate 113. Two field curvature correction electrodes, field curvature correction electrodes 112-3 and 112-4, are arranged below the multi-aperture lens plate 113 (in direction of the propagating beamlets). In the example of FIG. 10, the first field curvature correction electrode 112-1 is tilted in x-direction. The third field curvature correction electrode 112-3 is tilted in y-direction. With tilting the field curvature correction electrodes in x- and y-direction, a field curvature correction of sample tilt in x- and y-direction can be performed.

According to some embodiments, which may be combined with other embodiments described herein, the tilt of the electrode is not limited to the shown examples. For instance, the first electrode may be tilted alternatively or additionally to the second electrode. In some embodiments, it is possible to provide only electrode(s) being tilted in y-direction (instead or additionally the tilt in x-direction shown in FIGS. 8 and 9). Any other combination of tilted and non-tilted field curvature correction electrodes in any direction is possible. According to some embodiments, it is possible to combine a tilted field curvature correction electrode and a segmented field curvature correction electrode.

It may be understood that in any configuration described herein, one or more of the electrodes may be segmented as described above and as exemplarily shown in FIGS. 5 to 7. Any combination of tilted and segmented electrodes is possible within embodiments. For instance, a combination of tilted and non-tilted or a combination of segmented and non-segmented electrodes may be provided in some embodiments. According to some embodiments, the tilted or segmented electrode may be the electrode (among the electrodes of the charged particle beam device) being the nearest to the multi-aperture lens plate.

Going back to FIG. 1, further details of elements of the charged particle beam device 100 will be described in the following. For instance, a charged particle beam emitter as described herein may be a cold field emitter (CFE), a Schottky emitter, a TFE or another high current high brightness charged particle beam source (such as an electron beam source). A high current is considered to be 5 μA in 100 mrad or above, for example up to 5 mA, e.g. 30 μA in 100 mrad to 1 mA in 100 mrad, such as about 300 μA in 100 mrad. According to some implementations, the current is distributed essentially uniform, e.g. with a deviation of +−10%, particularly in the case of a linear or rectangular array.

According to yet further embodiments, which can be combined with other embodiments described herein, a TFE or another high reduced-brightness source, e.g. an electron-beam source, capable of providing a large beam current is a source where the brightness does not fall by more than 20% of the maximum value when the emission angle is increased to provide a maximum of 10 μA-100 μA, for example 30 μA.

In the examples shown in FIGS. 1 and 2, electrodes are shown, which may be driven to decelerate the primary charged particle beam 14 in the embodiment shown in FIGS. 1 and 2. The electrode(s) may be arranged between the charged particle beam emitter 111 and the multi-aperture lens plate 113 (as—for instance—also shown in FIG. 8). According to some embodiments described herein, the electrode(s) 112-1 (and 112-2 in the embodiment of FIG. 2) has aperture openings through which the primary charged particle beam 14 can pass.

According to some embodiments, which may be combined with other embodiments described herein, the electrode(s) may be adjustable, adaptable and/or controllable (e.g. by a controller) to compensate the field curvature introduced by one or more lenses of the charged particle beam device as described above. In particular, the electrodes may be adjustable to the respective operation of the charged particle beam device, to the intended use of the charged particle beam device, or to changing lens configurations and lens strengths, which may be used in the charged particle beam device. For instance, the voltage supplied to the electrodes may be adjustable, e.g. by a control unit and a respective control system (such as signal lines from the control unit to the voltage supply of the electrodes).

According to some embodiments, the electrode(s) as referred to herein may be macro electrodes. In some embodiments, the charged particle beam emitter of the charged particle beam source may include one or more extractor electrodes for providing an extraction voltage to the primary charged particle beam. According to some embodiments, the (field curvature correction) electrode(s) may be configured and/or controlled so that the field from the electrodes may end on the multi-aperture lens plate, forming low aberration single aperture lenses for the single primary charged particle beamlets.

In the embodiment of FIG. 1, the primary charged particle beam 14 can pass through the multi-aperture lens plate 113 after having left the charged particle beam emitter 111, and after having passed the first electrode 112. The primary charged particle beam 14 can pass through the multi-aperture lens plate 113 having multiple aperture openings and may be focused into beamlets by the deceleration field. The aperture openings can be situated in any array configuration on the multi-aperture lens plate 113 such as a line, rectangle, a square, a ring, or any suitable one-dimensional or two-dimensional array. According to embodiments described herein, the charged particle beam device as described herein allows to array the aperture openings of the multi-aperture lens plate in any configuration without having drawbacks due to field curvature or aberrations. For instance, known systems arrange the different beamlets in a ring-like shape for providing the same conditions for every beam passing a lens acting like a parabola. When arranging the beamlets on a ring-like shape, the field curvature influence of the respective lens can be minimized. With the charged particle beam device according to embodiments described herein, the arrangement of the beamlet array may be done in any arrangement, e.g. an arrangement suitable for fast inspection, an arrangement adapted to the specimen structure to be inspected, an arrangement allowing a large number of beams, an arrangement adapted to the beam intensity and the like. For example, the beamlet array may be arranged in a line, a rectangle or a square.

Figure 11:
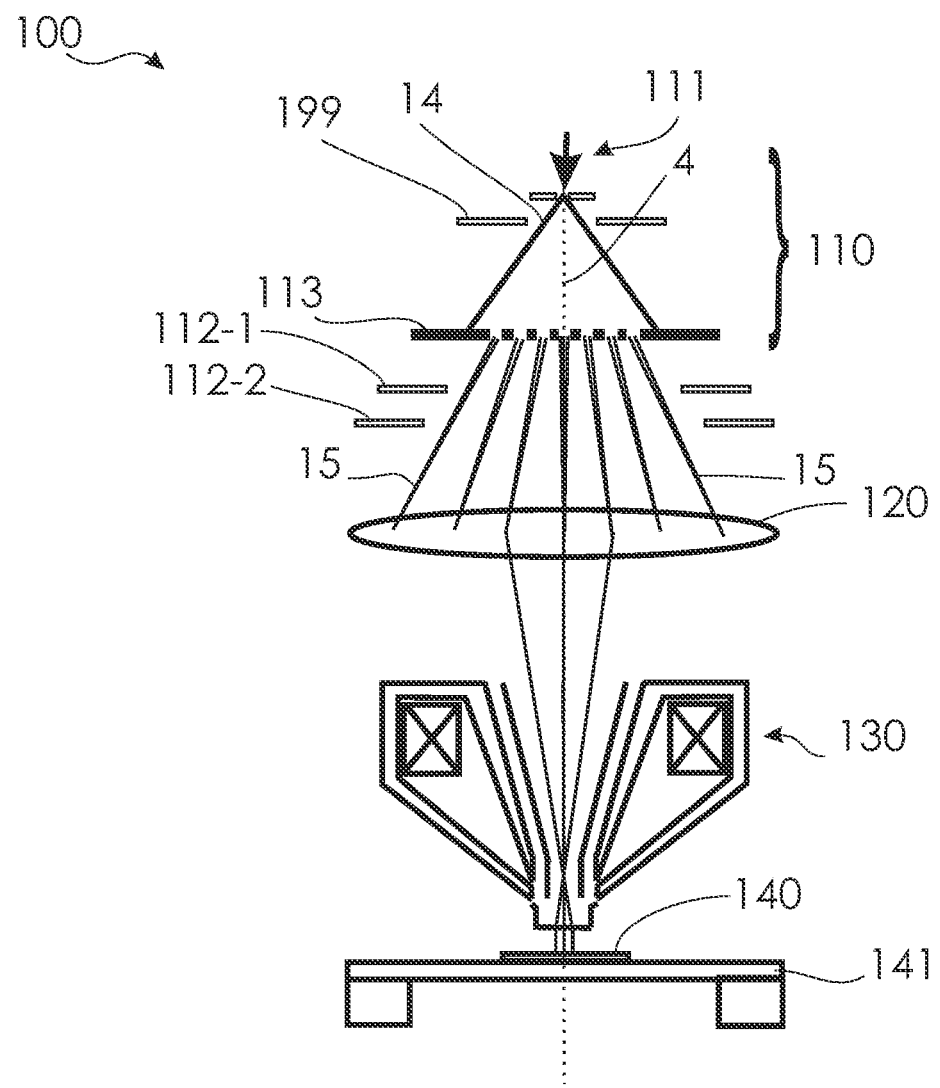
FIG. 11 shows a schematic drawing of a multi-beam device for specimen inspection according to embodiments described herein.

By illuminating the multi-aperture lens plate 113 with the primary charged particle beam 14, several focused primary charged particle beamlets 15 are created by using the deceleration field in front of the aperture plate. In the focus plane of the primary charged particle beamlets 15, a lens 120 may be arranged. According to some embodiments, the lens 120 may be an acceleration lens, in particular in the case, where the field curvature correction electrodes are driven in a decelerating mode and are arranged in front of the multi-aperture lens plate (when seen in a direction of the propagating primary charged particle beam). In some embodiments, the lens 120 being provided as an acceleration lens (or in other embodiments as a deceleration lens as can be seen in FIG. 11) may be an electrostatic or a combined magnetic-electrostatic lens. In some embodiments, the lens 120 may be provided as a magnetic lens.

In the figures, some of the primary charged particle beamlets of the array of primary charged particle beamlets are shown after the lens, while other primary charged particle beamlets are omitted in the drawings for the sake of a better overview. According to some embodiments described herein, the multi-aperture lens plate having aperture openings is provided for generating real sources for the primary charged particle beamlets.

In some embodiments, the multi-aperture lens plate 113 may directly be illuminated by the charged particle beam emitter 111. According to some embodiments, "directly" may mean that—apart from the first electrode in embodiments having the first electrode in front of the multi-aperture lens plate (when seen in a direction of the propagating primary charged particle beam)—no additional optical elements are provided between the charged particle beam emitter 111 and the multi-aperture lens plate. The multi-aperture lens plate splits the primary charged particle beam 14 emitted from the charged particle beam emitter into an array of primary charged particle beamlets 15. For instance, the multi-aperture lens plate has at least three aperture openings for splitting the primary charged particle beam into at least three primary charged particle beamlets. In the example shown in FIG. 1, seven primary charged particle beamlets 15 are shown in the schematic view. In some embodiments, the array of primary charged particle beamlets may be arranged in a one dimensional (line) arrays or 2-dimensional arrays (e.g. 4×4, 3×3, 5×5) or asymmetrical arrays e.g. 2×5. Embodiments described herein are not limited to the examples of arrays and may include any suitable array configuration of primary charged particle beamlets.

The described multi-aperture lens plate can beneficially be used in other embodiments relating to charged particle beam device, systems including arrays of charged particle beam devices and methods of operating charged particle beam devices. The design of the multi-aperture lens plate beneficially follows different criteria and has to be treated in the context of the overall charged particle optical ray path design. In some embodiments, which may be combined with other embodiments described herein, a multi-aperture lens plate may be provided with one or more of the following features. The number of aperture openings is a compromise between largest possible total current and optical performance, in particular achievable spot size in the largest possible beamlet field. Another boundary condition is the beamlet separation on the specimen, which assures a signal beamlet separation on the detectors, wherein crosstalk is reduced or avoided. According to yet further embodiments, which can be combined with other embodiments described herein, the grid configuration (i.e. the positions of the primary beamlets on the specimen and/or the positions of the aperture openings in the aperture plate) is provided to allow for a complete coverage of the substrate surface during a scan. The coverage is not limited to a pure charged particle beamlet scan, e.g. in the x-y-direction, but also includes a mixed scan operation like charged particle beamlet scan, e.g. in a first direction, such as the x-direction, and a stage movement in another direction different from the first direction, such as the y-direction.

According to embodiments described herein, the primary charged particle beamlets 15 are directed towards the lens 120. For instance, the lens 120 may be an acceleration lens for accelerating the primary charged particle beamlets 15 propagating from the multi-aperture lens plate. In some embodiments, the lens is placed directly after the multi-aperture lens plate 113 in direction of the propagating array of primary charged particle beamlets. The term "directly" in the context may mean that no additional beam optical elements are arranged between the multi-aperture lens plate and the lens. The lens 120 may be used for accelerating the primary charged particle beamlets 15 to a high column voltage in an embodiment, where the field curvature correction electrodes are placed before the multi-aperture lens plate in a direction of the propagating primary charged particle beam. For instance, the acceleration lens may accelerate the primary charged particle beamlets to a column voltage of typically larger than 10 kV, and more typically larger than 20 kV. The accelerating voltage may determine the velocity at which the charged particles of the charged particle beamlets travel down the column. In one example, the acceleration lens may be an electrostatic lens. According to embodiments described herein, the acceleration lens may direct the primary charged particle beamlets to (or near) a coma free point of an objective lens of the charged particle beam device.

According to some embodiments, which are described in detail below, a deflector array (not shown in the drawings) may be arranged within or near the lens. According to some embodiments, the deflector array being arranged "in or near" or "within" the lens may be understood in that the deflector array is placed within the focal length of the lens. For instance, the lens may include three electrodes and the deflector array may be placed within the three electrodes. According to some embodiments, the deflector array may approximately be placed at the height of the middle electrode of the three electrodes of the lens.

According to some embodiments, the lens may be used for achieving the main effect of directing the primary charged particle beamlets, for instance for directing the primary charged particle beamlets to the coma free point of the objective lens. A deflector array may be used in some embodiments for fine adjustment of the individual primary charged particle beamlets, especially the fine adjustment of the primary charged particle beamlets to be guided into or through the coma free point of the objective lens. The lens (and the deflector array, if any) being configured for guiding the primary charged particle beamlets to the coma free point of the objective lens may be understood in that the focal length of the lens, the voltage supplied to the lens, the voltage supplied to the deflector array, the size of the deflector array, the size of the single deflectors of the deflector arrays may be chosen for guiding the primary charged particle beamlets in the coma free point of the objective lens. The charged particle beam device may include a controller for controlling the operational parameters of the lens and the deflector array (e.g. a controller being connected or integrated in a feedback loop or a monitoring device for monitoring the operation of the charged particle beam device).

As used throughout the present disclosure, the term "coma-free plane" or "coma-free point" refers to a plane or a point of (or provided by) the objective lens at which minimum or even no coma is introduced in the primary charged particle beamlets when the primary charged particle beamlets pass through the coma-free point or coma-free plane. The coma-free point or coma-free plane of the objective lens is a point or plane of the objective lens at which the Fraunhofer condition (condition that the coma is zero) is satisfied. The coma-free point or coma-free plane of the objective lens is located on a z-axis of the optical system of the charged particle beam device, wherein the z-axis extends in a z-direction. The z-axis can correspond to the optical axis 4. In other words, the coma-free point of the objective lens is located on the optical axis 4. The coma-free point or coma-free plane can be positioned within the objective lens. As an example, the coma-free point or coma-free plane can be surrounded by the objective lens.

According to some embodiments described herein, the guidance of the beamlets through the coma-free point of the objective lens may be combined with any embodiment described herein. For instance, a charged particle beam device may be provided having the first electrode as described above and having an architectures with lens and/or deflector module(s) to guide the beamlets through the coma-free point of the objective lens.

According to embodiments described herein, the primary charged particle beamlets are focused on separate locations on the specimen 140 by the objective lens 130 to simultaneously inspect the specimen at the separate locations. The objective lens may be configured for focusing the primary charged particle beamlets onto the specimen 140, wherein the objective lens is a retarding field lens. For instance, the retarding field lens may decelerate the primary charged particle beamlets to a defined landing energy. In some embodiments, the energy reduction from the column energy to the landing energy on the specimen is at least a factor of 10, for example at least a factor of 30. In one example, the landing energy is typically between about 100 eV and 8 keV, more typically 2 keV or less, e.g. 1 keV or less, such as 500 eV or even 100 eV.

In some embodiments, which may be combined with other embodiments described herein, the objective lens 130 may be a field compound lens. For instance, the objective lens may be a combination of a magnetic lens and an electrostatic lens. Accordingly, the objective lens may be a compound magnetic-electrostatic lens. Typically, the electrostatic part of the compound magnetic-electrostatic lens is an electrostatic retarding field lens. Using a compound magnetic-electrostatic lens yields superior resolution at low landing energies, such as a few hundred electron volts in the case of a scanning electron microscope (SEM). Low landing energies are beneficial, especially in modern semiconductor industry, to avoid charging and/or damaging of radiation sensitive specimens. The benefits of embodiments described herein may also be achieved if a magnetic lens or an electrostatic lens is used.

According to some embodiments, the primary charged particle beamlets 15 of the charged particle beam device 100 are focused on the specimen 140 by a common objective lens. According to some embodiments, which can be combined with other embodiments described herein, all of the primary charged particle beamlets pass through one opening in the objective lens 130. The specimen 140 is provided on the specimen stage 141, which can move the specimen 140 in at least one direction perpendicular to the optical axis 4.

As mentioned above, the charged particle beam device according to embodiments described herein allows for providing an array of primary charged particle beamlets. According to some embodiments, the array of primary charged particle beamlets may typically include three or more primary charged particle beamlets per column, more typically ten or more primary charged particle beamlets. According to some embodiments described herein, the charged particle beam device and the method for inspecting a sample with a charged particle beam device according to embodiments described herein may provide an array of primary charged particle beamlets within one column of a charged particle beam device having a small distance to each other at the sample surface. For instance, the distance between two primary charged particle beamlets within one column may typically be less than 150 µm, more typically less than 100 µm, or even less than 50 µm. The charged particle beam device and the method for inspecting a specimen with a charged particle beam device according to embodiments described herein allows to inspect very small and narrow structure on the specimen.

In some embodiments, which will be referred to in detail below (especially with respect to FIG. 12), the charged particle beam device according to embodiments described herein allows to be arrayed in a multi-column microscope (MCM). Multiple columns each having an array of primary charged particle beamlets for inspecting a specimen increases the process speed and capacity.

The charged particle beam device 100 according to embodiments described herein may include a beam separator assembly. The beam separator assembly may separate the primary charged particle beamlets 15 from signal beams. According to some embodiments, the beam separator assembly can, for example, include at least one magnetic deflector, a Wien filter, or any other means, wherein the electrons are directed away from the primary charged particle beamlets beam, e.g. due to the velocity depending Lorenz force. In some embodiments, a beam separator can be a E×B beam separator, especially an achromatic beam separator (½ E×B beam separator), a 2-B separator, i.e. a beam separator with 2 magnetic fields, a 2-B separator with dispersion correction, a 2-B separator with a tilted upper part of the column for dispersion correction, or any of the above-mentioned 2-B separators having e.g. an additional signal electron bender to increase the bending angle of the signal beam 16 (e.g. to 45° to 90°). The secondary particles or signal particles are extracted from the specimen through the objective lens 130, are separated from the primary charged particle beamlets 15 in the beam separator assembly, and reach a detector assembly. The detector assembly may include one or more detector elements, which are configured for generation of a measurement signal, e.g. an electronic signal corresponding to the detected signal particles. According to some embodiments, the detector assembly may be a multi-channel detector for detecting the signal particles or signal beams generated by the interaction of the specimen with the primary charged particle beamlets.

According to some embodiments described herein, the charged particle beam device may include further beam optical elements, such as condenser lenses, (scanning) deflectors, beam benders, correctors, or the like. In some embodiments, a condenser lens may be placed before the multi-aperture lens plate (i.e. upstream of the primary charged particle beam when seen in a direction of the propagating primary charged particle beam). The charged particle beam device according to embodiments described herein may include a beam blanker, such as an individual beam blanker for each beamlet or a common beam blanker with a blanker aperture typically before the beam separator looking from the particle beam emitter.

FIG. 11 shows an embodiment of a charged particle beam device 100. The charged particle beam device 100 includes a charged particle beam source 110 having a charged particle beam emitter 111 and an acceleration electrode 199 (for providing a voltage difference between the charged particle beam emitter 111 and the acceleration electrode 199). The charged particle beam device 100 as exemplarily shown in FIG. 11 includes a multi-aperture lens plate 113 for dividing the primary charged particle beam 14 emitted from the charged particle beam emitter 111 into several primary charged particle beamlets 15. According to some embodiments, the multi-aperture lens plate 113 may be a multi-aperture lens plate as described in embodiments before. The charged particle beam device 100 further exemplarily includes two electrodes 112-1 and 112-2. In some embodiments, the configuration of FIG. 11 could also have only one electrode 112. In the embodiment shown in FIG. 11, the electrodes 112-1 and 112-2 are positioned behind the multi-aperture lens plate 113, especially when seen in a direction of the propagating primary charged particle beamlets 15. According to embodiments described herein, the may be electrodes as described in embodiments above.

In some embodiments, the electrodes of FIG. 11 are adapted to be driven in an acceleration mode. For instance, the electrodes may be connected to a controller for controlling the voltage supply to the electrodes. According to some embodiments, the electrodes being in acceleration mode may accelerate the primary charged particle beam or the primary charged particle beamlets propagating from the aperture lens plate.

In some embodiments, the lens 120 as shown in FIG. 11 may be a magnetic lens, a rotation free magnetic lens, a rotation free magnetic lens doublet, an electrostatic lens (e.g. with the possibility to decelerate or accelerate the primary charged particle beamlets), and/or a combined electrostatic-magnetic lens (e.g. with an acceleration function for the primary charged particle beamlets). In some embodiments, the lens may be a magnetic lens allowing easy mechanical access to the center (and e.g. the deflector array location). According to some embodiments, the lens 120 provides the main directing effect for directing the charged particle beamlets to a coma free of the objective lens 130. The fine tuning of the directing may be made with a deflector array within the lens 120 according to some embodiments. The focusing of the primary charged particle beamlets, the beam separation between primary charged particle beamlets and signal beams or beamlets, and the signal detection may be the same as described above.

Figure 12:
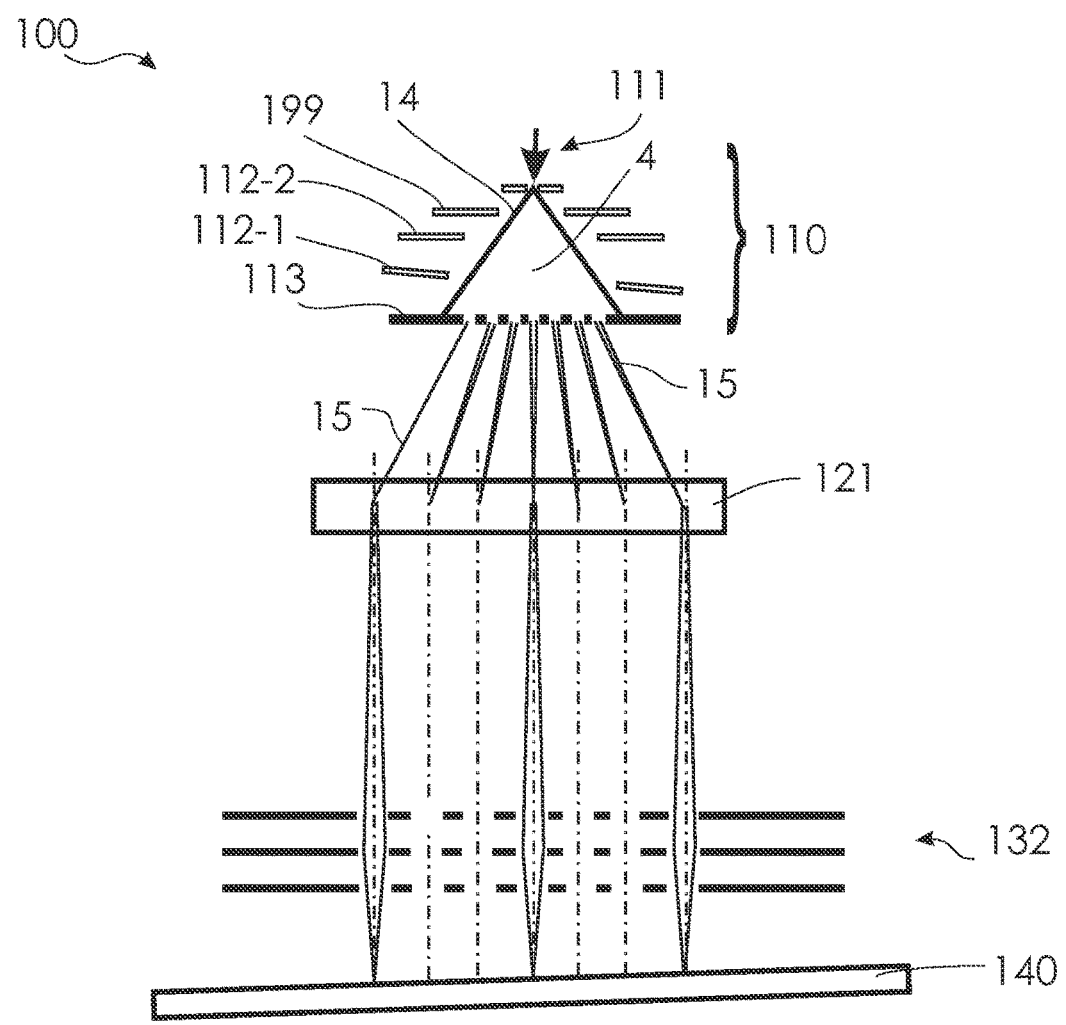
FIG. 12 shows a schematic drawings of a multi-beam device for specimen inspection according to embodiments described herein.

FIG. 12 shows an embodiment of a charged particle beam device according to embodiments described herein. The charged particle beam device 100 of FIG. 12 has a first electrode 112-1 providing an electrical field on the surface of the multi aperture lens plate 113, wherein the z-component of the electrical field is non-rotational symmetric on the surface of the multi-aperture lens plate. The charged particle beam device 100 of FIG. 12 can in particular be used for a sample tilt correction. The sample (or specimen 140) is exemplarily shown in a tilted manner in FIG. 12. According to some embodiments described herein, the sample tilt correction is performed in multi-beamlet columns having an objective lens array 132 for an individual beamlet focusing. According to some embodiments, the charged particle beam device 100 as shown in FIG. 12 includes a collimator arrangement 121. In some embodiments, the collimator arrangement may include a collimator lens and/or a deflector array. In particular, the collimator arrangement 121 is suitable for guiding the primary charged particle beamlets to a respective optical axis of the objective lens array 132.

According to some embodiments, which may be combined with other embodiments described herein, the objective lens array may include individual electrostatic lenses (in particular retarding field lenses), as exemplarily shown in FIG. 12. In some embodiments, an objective lens array may be used in embodiments described herein including individual magnetic lenses (in particular having a common excitation coil). According to some embodiments, an objective lens array used for a charged particle beam device according to embodiments described herein may include a combination of individual electrostatic lenses and individual magnetic lenses.

Figure 13:
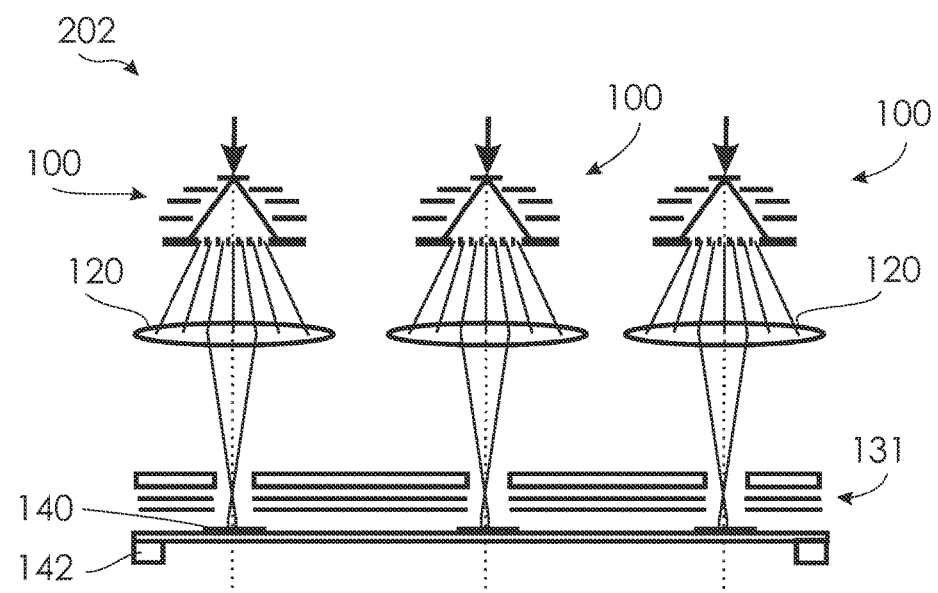
FIG. 13 shows a schematic drawing of a multi-column arrangement of charged particle beam devices according to embodiments described herein.

FIG. 13 shows a multi-column microscope configuration 202. The multi-column microscope configuration 202 is exemplarily shown with three charged particle beam devices 100. The number of charged particle beam device may deviate from the shown example in multi-column microscope configuration according to embodiments described herein. For instance, a multi-column microscope configuration according to embodiments described herein may have less than three charged particle beam devices, such as two, or more than three charged particle beam devices, such as four, five, or even more than five. Each of the charged particle beam devices of the multi-column microscope configuration may be a charged particle beam device as described in any embodiments described herein, in particular with respect to FIGS. 1, 2 and 11. According to embodiments described herein, the multi-column microscope configuration may include a field curvature correction device having at least two field curvature correction electrodes as described above, in particular with respect to FIGS. 3 to 10.

In the exemplary view of FIG. 13, the multi-column microscope includes charged particle beam devices as shown and described in FIG. 2. The multi-column microscope configuration 202 includes a specimen stage 142, on which several specimen 140 to be inspected are placed. In some embodiments, the charged particle beam devices of the multi-column microscope configuration 202 may inspect one specimen together. In some embodiments, the specimen stage 142 may be adapted for being tilted with respect to a plane being substantially perpendicular to the optical axis of the charged particle beam device.

According to some embodiments described herein, the charged particle beam devices 100 of the multi-column microscope configuration 202 may have a common objective lens 131 (shown in a simplified schematic view) including electrostatic lens components and magnetic lens components e.g. a magnetic lens with multiple bores and common excitation coil. The electrostatic lens component may include an upper electrode, which lies on a high potential and a lower electrode, which lies on a potential close to the specimen voltage and which decelerates the electrons for providing the landing energy. The electrodes contribute to directing the primary charged particle beamlets, as well as to slowing down the primary charged particle beamlets. Additionally a control electrode, e.g. a proxi-electrode, for extracting the signal particles, such as secondary electrons (SE) or backscattered electrons, may be provided. For instance, with the objective lens according to embodiments described herein, the very low landing energy, e.g. 100 eV and a low extraction field, can be provided without deteriorating overall performance of the charged particle beam imaging system.

The charged particle beam device and the multi-column microscope configuration according to embodiments described herein can be described as being flexible in operation conditions (e.g. the landing energy of the primary charged particle beamlets, the extraction voltage of the signal beams) without significant performance loss, in particular due to the low aberrations of the charged particle beam device according to embodiments described herein.

Although the objective lens having a lower electrode, a middle electrode and an upper electrode, as well as eventually a proxi electrode, are described with respect to the multi-column microscope configuration, the described electrodes may also be used (together or alone) for an objective lens in a single charged particle beam device as described in embodiments herein, and in particular with respect to FIG. 1, 2 or 11.

According to some embodiments, the charged particle beam devices 100 of the multi-column microscope configuration may have a distance to each other of typically between about 10 mm to about 60 mm, more typically between about 10 mm and about 50 mm. In some embodiments, the distance between the single charged particle beam devices of the multi-column microscope configuration may be measured as distance between the optical axes of the charged particle beam devices.

By using several charged particle beam devices in a multi-column microscope configuration as exemplarily shown in FIG. 13, a sufficient number of primary charged particle beamlets can be provided at a sufficient resolution and with a sufficiently small crosstalk between signal beamlets.

Figure 14:
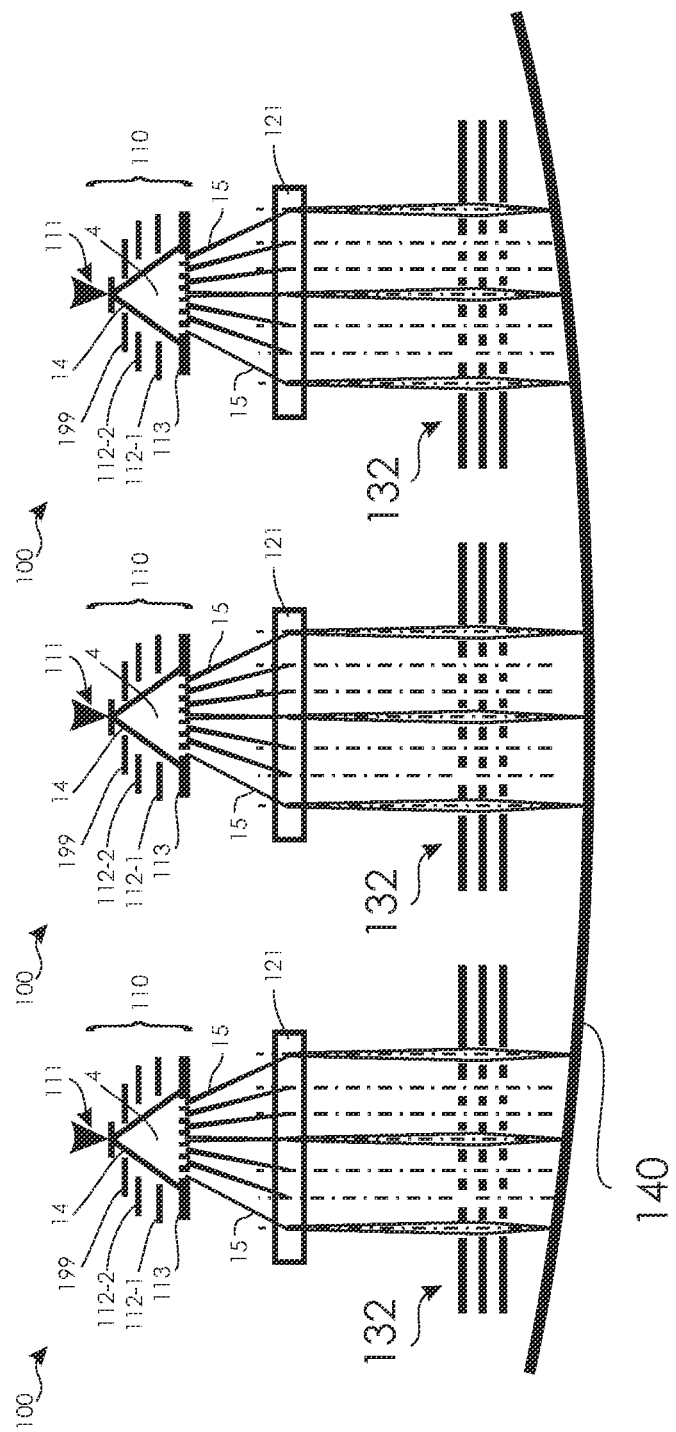
FIG. 14 shows a schematic drawings of a multi-column arrangement of charged particle beam devices according to embodiments described herein.

FIG. 14 shows a multi-column microscope (MCM) configuration according to embodiments described herein. The multi-column microscope configuration shown in FIG. 14 may for instance be used for focus compensation, e.g. based on a sample bending in multi-beamlets columns in a multi-column microscope configuration. In particular, the option to compensate for correction of sample tilt maybe interesting in MCM configurations applying multi-beamlet columns (e.g. of charged particle beam devices described above) which are spread over the total sample. Since sample bending may create locally tilted sample surface below the different columns (as shown in FIG. 14), a local sample tilt within the coverage of one multi-beamlet can be compensated by embodiments described herein.

The MCM configuration of FIG. 14 exemplarily includes three charged particle beam devices 100. Each of the three charged particle beam devices shown in FIG. 14 includes a first electrode 112-1 and a second electrode 112-2. According to some embodiments, the first electrode 112-1 and/or the second electrode 112-2 may be a segmented electrode as described in embodiment herein. Each of the charged particle beam devices may include a collimator arrangement 121 and an objective lens array 132, as described in detail above (e.g. with respect to FIG. 12).

Figure 15:
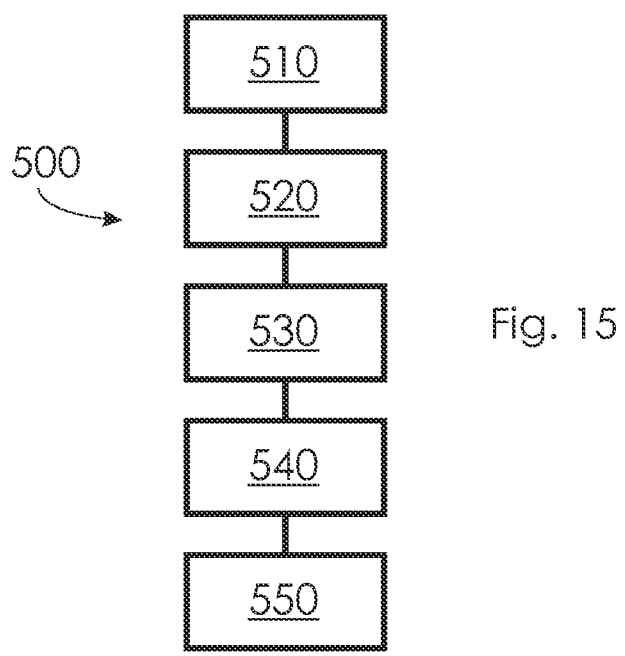
FIG. 15 shows a flow chart of a method for inspecting a specimen with a charged particle beam device according to embodiments described herein.

According to some embodiments, a method for inspecting a specimen with an array of primary charged particle beamlets in a charged particle beam device is described. In FIG. 15, a flowchart 500 of the method for inspecting is shown. According to some embodiments, which may be combined with other embodiments described herein, the charged particle beam device as used in the method may be a charged particle beam device as described in embodiments herein, especially with respect to FIGS. 1, 2 and 11. The method according to embodiments described herein may also be performed with a multi-column microscope configuration as described in some embodiments, such as the embodiment shown in FIG. 12.

In block 510, the method according to embodiments described herein includes the generation of a primary charged particle beam with a charged particle beam source including a beam emitter. The beam emitter may for instance be a source may be a CFE, a Schottky emitter, a TFE or another high current—high brightness charged particle beam source (such as an electron beam source), as e.g. mentioned above. According to some embodiments, the beam emitter may emit one primary charged particle beam, which may be processed (e.g. by being split up by a multi-aperture lens) so that a plurality of primary charged particle beamlets are generated. The beamlets are directed behind the multi-aperture lens to the plane of a lens (which may be an acceleration lens in some embodiments). According to some embodiments, which may be combined with other embodiments described herein, the beam emitter may include extraction electrodes for supporting (and directing) the extraction of the charged particles from the beam emitter.

In block 520, the method further includes illuminating the multi-aperture lens plate with the primary charged particle beam to generate an array of primary charged particle beamlets. For instance, the multi-aperture lens plate may have a plurality of aperture openings, which result in the primary charged particle beam being split into several focused primary charged particle beamlets. The grid configuration or the arrangement of the aperture openings of the multi-aperture lens plate may be suitably chosen, as described and discussed in detail above. For instance, the aperture openings in the multi-aperture lens plate may be arranged so as to 1-dimensional beamlet array, or a 2-dimensional beamlet array, such as—for instance—a rectangular or quadratic beamlet array In block 530, the method further includes generating an electrical field by at least a first electrode on the surface of the multi-aperture lens plate, wherein the first electrode includes an aperture opening. According to some embodiments, which may be combined with other embodiments described herein, the first electrode may be an electrode as described in embodiments above, in particular as described with respect to FIGS. 3 to 10. According to some embodiments, the first electrode may be used for correcting field curvature introduced to the charged particle beam device by the imaging lenses, such as the objective lens of the charged particle beam device, as described in detail above.

In block 540, a voltage is applied to the first electrode. According to embodiments described herein, the component in z-direction of the electrical field provided by the first electrode is non-rotational-symmetric on the surface of the multi-aperture lens plate. For instance, the varying field strength may be provided by a segmented electrode as particularly described with respect to FIGS. 5 to 7. In some embodiments, the varying field strength of the at least one field curvature correction electrode may be provided by a tilted electrode, as particularly described with respect to FIGS. 8 to 10. According to some embodiments (especially in the case, where at least one tilted electrode is used), the field strength may be substantially constant in a plane being tilted (in x- and/or y-direction) with respect to a plane being perpendicular to the optical axis.

In some embodiments, which may be combined with other embodiments described herein, the method may include controlling and/or adjusting the first electrode to the intended application, to the lenses used in the charged particle beam device, and to other suitable operation parameters of the charged particle beam device. In some embodiments, the electrode may be driven in acceleration or deceleration mode (as exemplarily shown in FIGS. 1, 2 and 11). For instance, the electrode may have a decelerating effect, when arranged in front of the multi-aperture lens plate (in a direction of the propagating primary charged particle beam). In one example, the electrode may have an accelerating effect, when arranged behind the multi-aperture lens plate (in a direction of the propagating primary charged particle beam).

In block 550, the primary charged particle beamlets are focused on separate locations on the specimen with the objective lens of the charged particle beam device to simultaneously inspect the specimen at the separate locations. According to some embodiments, the dynamic field curvature correction according to embodiments described herein allows the objective lens focusing the primary charged particle beamlets in a precise way onto the specimen with reduced or very low aberrations.

According to some embodiments, the method may further include applying a voltage to a proxi electrode near to the objective lens (such as between the specimen and the objective lens) for facilitating the extraction signal particles or signal beams from the specimen. The signal beam may be separated from the primary charged particle beamlets by a beam separator, especially an achromatic beam separator. In some embodiments, the signal beam is bent by a beam bender to direct the signal beam to a detector assembly, especially an off-axis detector assembly. The method may further include detecting the signal beam by the detector assembly, and in particular by a multi-channel detector assembly.

In some embodiments, the method may include processing the data obtained by the detector for generating an image of the specimen, or for having the data in a format allowing evaluating the structure of the specimen.

The present disclosure provides a plurality of embodiments. Exemplary embodiments are listed below.

Embodiment 1

A method of inspecting a specimen with an array of primary charged particle beamlets in a charged particle beam device, generating a primary charged particle beam with a charged particle beam emitter of a charged particle beam source; illuminating a multi-aperture lens plate with the primary charged particle beam to generate the array of primary charged particle beamlets which are focused; correcting a field curvature of the charged particle beam device with at least two electrodes, wherein the at least two electrodes include aperture openings; directing the primary charged particle beamlets with a lens towards an objective lens of the charged particle beam device; guiding the primary charged particle beamlets through a deflector array arranged within the lens; wherein the combined action of the lens and the deflector array directs the primary charged particle beamlets through a coma free point of the objective lens of the charged particle beam device; and focusing the primary charged particle beamlets on separate locations on the specimen with the objective lens to simultaneously inspect the specimen at the separate locations.

Embodiment 2

The method according to embodiment 1, wherein correcting the field curvature of the charged particle beam device with at least two electrodes includes placing the at least two electrodes between the charged particle beam source and the multi-aperture lens plate.

Embodiment 3

The method according to embodiment 1 or 2, wherein correcting a field curvature of the charged particle beam device with the at least two electrodes includes operating the at least two electrodes in deceleration mode decelerating the primary charged particle beam or the primary charged particle beamlets.

Embodiment 4

The method according to embodiment 1, wherein correcting the field curvature of the charged particle beam device with at least two electrodes includes placing the at least two electrodes behind the multi-aperture lens plate in a direction of the propagating primary charged particle beamlets.

Embodiment 5

The method according to embodiment 1 or 4, wherein correcting a field curvature of the charged particle beam device with the at least two electrodes includes operating the at least two electrodes in acceleration mode accelerating the primary charged particle beam or the primary charged particle beamlets.

Embodiment 6

The method according to any of embodiments 1 to 5, wherein the lens is chosen from the group consisting of: an electrostatic lens, a combined electrostatic-magnetic lens, a magnetic lens, and a rotation-free magnetic lens doublet.

Embodiment 7

The method according to any of embodiments 1 to 6, wherein signal charged particle beamlets are generated on impingement or backscattering of the primary charged particle beamlets on the specimen, and wherein the signal charged particle beamlets are separated from the primary charged particle beamlets by a magnetic field of a beam separator arranged between the lens and the objective lens.

Embodiment 8

The method according to any of embodiments 1 to 7, wherein the deflector array includes a plurality of quadrupole elements for individually aligning the primary charged particle beamlets.

Embodiment 9

The method according to any of embodiments 1 to 8, wherein the array of primary charged particle beamlets includes at least three primary charged particle beamlets.

Embodiment 10

The method according to any of embodiments 1 to 9, further including impinging of the primary charged particle beamlets on the specimen, wherein each of the primary charged particle beamlets provides a spot on the specimen, the spot having a spot size of less than 20 nm.

Embodiment 11

The method according to any of embodiments 1 to 10, further including impinging of the primary charged particle beamlets on the separate locations of the specimen, wherein the smallest distance between any of the charged particle beamlets on impingement on the specimen is less than 150 µm.

Embodiment 12

Charged particle beam device for inspection of a specimen with an array of primary charged particle beamlets, the charged particle beam device including: a charged particle beam source for generating an array of primary charged particle beamlets, wherein the charged particle beam source includes: a charged particle beam emitter for emitting a charged particle beam, a multi-aperture lens plate including at least two openings to generate and focus an array of primary charged particle beamlets, the multi-aperture lens plate being arranged for being illuminated with the primary charged particle beam. The charged particle beam device further includes a field curvature correction device for correcting a field curvature of the charged particle beam device, wherein the field curvature correction device includes at least two field curvature correction electrodes having aperture openings through which the primary charged particle beam or the primary charged particle beamlets pass; a lens configured for directing the array of primary charged particle beamlets to an objective lens of the charged particle beam device; a deflector array arranged within the lens, wherein the lens and the deflector array are configured for directing the primary charged particle beamlets through a coma free point of an objective lens by the combined action of the lens and the deflector array; and an objective lens for decelerating and focusing each primary charged particle beamlet of the array of primary charged particle beamlets to a separate location on the specimen.

Embodiment 13

The charged particle beam device according to embodiment 12, wherein the field curvature correction device is placed between the charged particle beam emitter and the multi-aperture lens plate.

Embodiment 14

The charged particle beam device according to embodiment 12, wherein the field curvature correction device is placed behind the multi-aperture lens plate in a direction of the propagating primary charged particle beamlets.

Embodiment 15

The charged particle beam device according to embodiment 12 or 13, wherein the lens is placed directly after the multi-aperture lens plate in direction of the propagating array of primary charged particle beamlets.

Embodiment 16

The charged particle beam device according to any of embodiments 12 to 15, wherein the lens is chosen from the group consisting of: an electrostatic lens, a combined electrostatic-magnetic lens, a magnetic lens, and a rotation-free magnetic lens doublet.

Embodiment 17

The charged particle beam device according to any of embodiments 12 to 16, wherein each of the primary charged particle beamlets of the array of primary charged particle beamlets provides a spot on the specimen, the spot having a spot size of less than 20 nm.

Embodiment 18

The charged particle beam device according to any of embodiments 12 to 17, further including a beam separator for separating the primary charged particle from signal charged particle beamlets generated upon impingement or backscattering of the primary charged particle beamlets on or from the specimen.

Embodiment 19

A multi-column microscope configuration with at least two charged particle beam devices configured to image a specimen, each of the at least two charged particle beam devices including: a charged particle beam source for generating an array of primary charged particle beamlets, wherein the charged particle beam source includes: a charged particle beam emitter for emitting a charged particle beam, a multi-aperture lens plate including at least two openings to generate an array of primary charged particle beamlets, the multi-aperture lens plate being arranged for being illuminated with the primary charged particle beam. The multi column microscope configuration further includes a field curvature correction device for correcting a field curvature of the charged particle beam device, wherein the field curvature correction device includes at least two field curvature correction electrodes having aperture openings through which the primary charged particle beam passes; a lens configured for directing the array of primary charged particle beamlets towards an objective lens of the charged particle beam device; and a deflector array arranged within the lens; wherein the lens and the deflector array are configured for directing the primary charged particle beamlets through a coma free point of an objective lens by the combined action of the lens and the deflector array, wherein the multi-column microscope configuration further includes: an objective lens for decelerating and focusing each primary charged particle beamlet to a separate location on the specimen.

Embodiment 20

The multi-column microscope configuration according to embodiment 19, wherein the objective lens of the at least two charged particle beam devices includes at least two lens modules, each including a first pole piece, a second pole piece and at least one opening for a primary charged particle beamlet, and wherein the objective lens further includes at least one excitation coil providing a magnetic flux to the at least two lens modules.

While the foregoing is directed to embodiments, other and further embodiments may be devised without departing from the basic scope thereof, and the scope thereof is determined by the claims that follow.

The invention claimed is:

1. Method for inspecting a specimen with an array of primary charged particle beamlets in a charged particle beam device having an optical axis extending in z-direction of the charged particle beam device, the method comprising:
    generating a primary charged particle beam with a charged particle beam emitter;
    illuminating a multi-aperture lens plate having a surface with the primary charged particle beam to generate the array of primary charged particle beamlets which are focused;
    generating an electrical field by at least a first electrode on the surface of the multi-aperture lens plate;
    wherein a field component in z-direction of the electrical field provided by the at least first electrode is non-rotational-symmetric; and
    focusing the primary charged particle beamlets on separate locations on the specimen with an objective lens to simultaneously inspect the specimen at the separate locations.

2. The method according to claim 1, wherein the at least first electrode is arranged before the aperture lens plate in direction of the propagating primary charged particle beamlets.

3. The method according to claim 1, wherein the at least first electrode is arranged after the aperture lens plate in direction of the propagating primary charged particle beamlets.

4. The method according to claim 1, wherein a non-rotational-symmetric z-component of the electrical field provided by the at least first electrode is provided by the at least first electrode being segmented in circumferential direction into at least two separate electrode segments.

5. The method according to claim 4, wherein the at least first electrode is segmented provides a dipole, a quadrupole or a pole of higher order.

6. The method according to claim 1, wherein a non-rotational-symmetric z-component of the electrical field provided by the at least first electrode is provided by the at least first electrode being tilted with respect to a plane being perpendicular to the optical axis of the charged particle beam device.

7. The method according to claim 1, further comprising:
    measuring a sample tilt or a local sample tilt of the specimen; and
    generating the electrical field with a field strength in proportion to that tilt or with a field strength to at least partially compensate the sample tilt or the local sample tilt.

8. The method according to claim 1, further comprising scanning the primary charged particle beamlets over the specimen by a scan deflector, wherein a z-component of the electrical field generated by the at least first electrode on the surface of the multi-aperture lens plate has an amplitude proportional to an excitation of the scan deflector.

9. A charged particle beam device for inspection of a specimen with an array of primary charged particle beamlets, the charged particle beam device comprising an optical axis extending in z-direction of the charged particle beam device and further comprising:
- a charged particle beam source for generating an array of primary charged particle beamlets, wherein the charged particle beam source comprises:
  - a charged particle beam emitter for emitting a charged particle beam;
  - a multi-aperture lens plate having a surface, the multi-aperture lens plate comprising at least two openings to generate and focus an array of primary charged particle beamlets, the multi-aperture lens plate being arranged for being illuminated with the primary charged particle beam;
- at least a first electrode for generating an electrical field on the surface of the multi-aperture lens plate; the at least first electrode having a radial direction, a circumferential direction and an aperture opening through which the primary charged particle beam or the primary charged particle beamlets pass;
- wherein the at least first electrode is segmented in circumferential direction into at least two separate electrode segments; and
- an objective lens for focusing each primary charged particle beamlet of the array of primary charged particle beamlets to a separate location on the specimen.

10. The charged particle beam device according to claim 9, wherein the separate electrode segments are separately biasable with different voltages.

11. The charged particle beam device according to claim 9, wherein the first electrode being segmented provides a dipole, a quadrupole or a pole of higher order.

12. The charged particle beam device according to claim 9, wherein the at least first electrode is arranged before the aperture lens plate in direction of the propagating primary charged particle beamlets.

13. The charged particle beam device according to claim 9, wherein the at least first electrode is arranged after the aperture lens plate in direction of the propagating primary charged particle beamlets.

14. The charged particle beam device according to claim 9, further comprising a scan deflector for scanning the primary charged particle beamlets over the specimen.

15. The charged particle beam device according to claim 9, wherein the at least first electrode is tilted with respect to a plane being perpendicular to the optical axis of the charged particle beam device.

16. The charged particle beam device according to claim 9, further comprising:
- at least one of a lens module and a deflector module to guide primary charged particle beamlets of the array of primary charged particle beamlets through a coma-free point of the objective lens.

17. A charged particle beam device for inspection of a specimen with an array of primary charged particle beamlets, the charged particle beam device comprising an optical axis extending in z-direction of the charged particle beam device and further comprising:
- a charged particle beam source for generating an array of primary charged particle beamlets, wherein the charged particle beam source comprises:
  - a charged particle beam emitter for emitting a charged particle beam;
  - a multi-aperture lens plate comprising at least two openings to generate and focus an array of primary charged particle beamlets, the multi-aperture lens plate being arranged for being illuminated with the primary charged particle beam;
- at least a first electrode for generating an electrical field on a surface of the multi-aperture lens plate; the at least first electrode having aperture openings through which the primary charged particle beam or the primary charged particle beamlets pass;
- wherein the at least first electrode is tilted with respect to a plane being perpendicular to the optical axis of the charged particle beam device; and
- an objective lens for focusing each primary charged particle beamlet of the array of primary charged particle beamlets to a separate location on the specimen.

18. The charged particle beam device according to claim 17, wherein the first electrode is tilted in x- or y-direction being both perpendicular to the z-direction.

19. The charged particle beam device according to claim 17, wherein the first electrode is arranged before the aperture lens plate in direction of the propagating primary charged particle beamlets.

20. The charged particle beam device according to claim 17, wherein the first electrode is arranged after the aperture lens plate in direction of the propagating primary charged particle beamlets.

21. The charged particle beam device according to claim 17, wherein the first electrode is segmented in circumferential direction into at least two separate electrode segments.

22. The charged particle beam device according to claim 17, wherein the charged particle beam device is adapted for supporting the specimen in a tilted manner.

23. The charged particle beam device according to claim 17, further comprising:
- at least one of a lens module and a deflector module to guide primary charged particle beamlet of the array of primary charged particle beamlets through a coma-free point of the objective lens.

24. A multi-column microscope for inspection of a specimen, comprising:
- a charged particle beam device for inspection of a specimen with an array of primary charged particle beamlets, the charged particle beam device comprising an optical axis extending in z-direction of the charged particle beam device and further comprising:
  - a charged particle beam source for generating an array of primary charged particle beamlets, wherein the charged particle beam source comprises:
    - a charged particle beam emitter for emitting a charged particle beam;
    - a multi-aperture lens plate comprising at least two openings to generate and focus an array of primary charged particle beamlets, the multi-aperture lens plate being arranged for being illuminated with the primary charged particle beam;
  - at least a first electrode for generating an electrical field on a surface of the multi-aperture lens plate; the at least first electrode having aperture openings through which the primary charged particle beam or the primary charged particle beamlets pass,
  - wherein the at least first electrode is tilted with respect to a plane being perpendicular to the optical axis of the charged particle beam device and/or wherein the at least first electrode is segmented in circumferential direction into at least two separate electrode segments; and the charged particle beam device further comprises an objective lens for focusing each primary charged particle beamlet of the array of primary charged particle beamlets to a separate location on the specimen;

the multi column microscope further comprises:

a further charged particle beam source for generating a further array of primary charged particle beamlets.

25. The multi column microscope according to claim 23, further comprising:

at least one of a lens module and a deflector module to guide primary charged particle beamlet of the array of primary charged particle beamlets through a coma-free point of the objective lens.

26. The multi column microscope according to claim 23, further comprising:

a collimator having at least one of collimator lens and a deflector array to guide the primary charged particle beamlet of the array of primary charged particle beamlets to the respective optical axis of an objective lens array.

27. The multi column microscope according to claim 26, wherein the objective lens array comprises one or more of individual electrostatic lenses and individual magnetic lenses.

28. The multi column microscope according to claim 27, wherein the individual electrostatic lenses are retarding field lenses.

29. The multi column microscope according to claim 27, wherein the individual magnetic lenses have a common excitation coil.

* * * * *